(12) United States Patent
Ozaki et al.

(10) Patent No.: US 9,395,389 B2
(45) Date of Patent: Jul. 19, 2016

(54) ROTATION DETECTOR, WHEEL BEARING EQUIPPED THEREWITH AND PROCESS FOR MANUFACTURING THE SAME

(71) Applicant: NTN CORPORATION, Osaka (JP)

(72) Inventors: Takayoshi Ozaki, Iwata (JP); Tomomi Ishikawa, Iwata (JP); Toru Takahashi, Iwata (JP)

(73) Assignee: NTN CORPORATION, Osaka (JP)

( * ) Notice: Subject to any disclaimer, the term of this patent is extended or adjusted under 35 U.S.C. 154(b) by 415 days.

(21) Appl. No.: 13/859,198

(22) Filed: Apr. 9, 2013

(65) Prior Publication Data

US 2013/0221952 A1    Aug. 29, 2013

Related U.S. Application Data

(62) Division of application No. 12/311,187, filed as application No. PCT/JP2007/001031 on Sep. 22, 2007, now abandoned.

(30) Foreign Application Priority Data

| Sep. 22, 2006 | (JP) | 2006-256827 |
| Sep. 27, 2006 | (JP) | 2006-262182 |
| Sep. 27, 2006 | (JP) | 2006-262183 |
| Sep. 27, 2006 | (JP) | 2006-262184 |
| Sep. 27, 2006 | (JP) | 2006-262185 |
| Sep. 27, 2006 | (JP) | 2006-262186 |
| Sep. 27, 2006 | (JP) | 2006-262187 |
| Oct. 16, 2006 | (JP) | 2006-281304 |
| Aug. 30, 2007 | (JP) | 2007-223481 |

(51) Int. Cl.
*G01B 7/30* (2006.01)
*G01R 1/04* (2006.01)
(Continued)

(52) U.S. Cl.
CPC .. *G01R 1/04* (2013.01); *G01B 7/30* (2013.01); *G01R 33/0005* (2013.01);
(Continued)

(58) Field of Classification Search
CPC ............................................. G01B 7/30
USPC ............................................. 324/207.25
See application file for complete search history.

(56) References Cited

U.S. PATENT DOCUMENTS

| 4,847,557 A | 7/1989 | Saito et al. |
| 5,039,942 A | 8/1991 | Buchschmid et al. |

(Continued)

FOREIGN PATENT DOCUMENTS

| CN | 2041072 | 7/1989 |
| CN | 2634689 | 8/2004 |

(Continued)

OTHER PUBLICATIONS

Japanese Office Action mailed Jun. 12, 2012 issued in corresponding Japanese Patent Application No. 2006-262183.

(Continued)

*Primary Examiner* — Bot Ledynh

(57) ABSTRACT

A sensor assembly is sandwiched together with a rubber material mixed with a vulcanizing agent in a mold assembly including an upper mold and a lower mold. The upper and lower molds, while completely sandwiching the sensor assembly, are heated for a predetermined length of time, and a pressure is then applied to the sensor assembly to complete a compressive molding.

18 Claims, 17 Drawing Sheets

(51) Int. Cl.
*G01R 33/00* (2006.01)
*G01R 33/07* (2006.01)
*F16C 41/00* (2006.01)

(52) U.S. Cl.
CPC ....... *G01R 33/0047* (2013.01); *G01R 33/0052* (2013.01); *G01R 33/07* (2013.01); *F16C 41/007* (2013.01); *Y10T 29/49002* (2015.01)

(56) References Cited

U.S. PATENT DOCUMENTS

| | | | |
|---|---|---|---|
| 5,123,755 | A | 6/1992 | Faye et al. |
| 5,278,496 | A | 1/1994 | Dickmeyer et al. |
| 5,641,997 | A | 6/1997 | Ohta et al. |
| 5,661,342 | A | 8/1997 | Kawamoto |
| 5,873,658 | A | 2/1999 | Message et al. |
| 6,025,710 | A | 2/2000 | Schneider et al. |
| 6,228,688 | B1 | 5/2001 | Ohta et al. |
| 6,559,633 | B1 | 5/2003 | Nachtigal et al. |
| 6,963,133 | B2 | 11/2005 | Teshima |
| 6,994,472 | B2 | 2/2006 | Inoue |
| 7,375,406 | B2 | 5/2008 | Lamb et al. |
| 2002/0097040 | A1 | 7/2002 | Takizawa et al. |
| 2004/0080314 | A1 | 4/2004 | Tsujii et al. |
| 2006/0061352 | A1 | 3/2006 | Koyagi et al. |
| 2008/0159675 | A1 | 7/2008 | Torii |

FOREIGN PATENT DOCUMENTS

| | | |
|---|---|---|
| JP | 1-105565 | 4/1989 |
| JP | 2-502481 | 8/1990 |
| JP | 2-135882 | 11/1990 |
| JP | 5-72304 | 3/1993 |
| JP | 8-14953 | 1/1996 |
| JP | 8-139113 | 5/1996 |
| JP | 10-85219 | 4/1998 |
| JP | 10-275818 | 10/1998 |
| JP | 2000-88984 | 3/2000 |
| JP | 2001-141738 | 5/2001 |
| JP | 2001-165701 | 6/2001 |
| JP | 2006-83878 | 3/2006 |
| WO | 2006/088012 A1 | 8/2006 |

OTHER PUBLICATIONS

Japanese Office Action mailed Jun. 12, 2012 issued in corresponding Japanese Patent Application No. 2006-262182.
Japanese Office Action mailed Jun. 12, 2012 issued in corresponding Japanese Patent Application No. 2007-223481.
Japanese Office Action issued Jun. 7, 2011 in corresponding Japanese Patent Application 2006-262184.
Chinese Office Action issued May 25, 2011 in corresponding Chinese Patent Application 200780035016.4.
Japanese Office Action issued Mar. 29, 2011 in corresponding Japanese Patent Application 2006-262184.
English Translation of the International Preliminary Report on Patentability, mailed Apr. 2, 2009.
International Search Report for International Application No. PCT/JP2007/001031, mailed Oct. 23, 2007.
U.S. Office Action mailed Nov. 10, 2011 in copending U.S. Appl. No. 12/311,187.
U.S. Office Action mailed Apr. 4, 2012 in copending U.S. Appl. No. 12/311,187.
U.S. Office Action mailed Aug. 31, 2012 in copending U.S. Appl. No. 12/311,187.
U.S. Office Action mailed Jan. 17, 2013 in copending U.S. Appl. No. 12/311,187.

ROTATION DETECTOR, WHEEL BEARING EQUIPPED THEREWITH AND PROCESS FOR MANUFACTURING THE SAME

CROSS-REFERENCE TO RELATED APPLICATIONS

This application is a divisional of U.S. application Ser. No. 12/311,187, filed on Mar. 20, 2009, which claims the benefit under 35 U.S.C. Section 371, of PCT International Application No. PCT/JP2007/001031, filed Sep. 21, 2007, which claimed priorities to Japanese Application Nos. 2006-256827, filed Sep. 22, 2006; Japanese Application No. 2006-262182, filed Sep. 27, 2006; Japanese Application No. 2006-262183, filed Sep. 27, 2006; Japanese Application No. 2006-262184, filed Sep. 27, 2006; Japanese Application No. 2006-262185, filed Sep. 27, 2006; Japanese Application No. 2006-262186, filed Sep. 27, 2006; Japanese Application No. 2006-262187, filed Sep. 27, 2006; Japanese Application No. 2006-281304, filed Oct. 16, 2006; Japanese Application No. 2007-223481, filed Aug. 30, 2007; the disclosures of all of which are hereby incorporated by reference.

BACKGROUND

1. Field

The present invention relates to a rotation detecting device adapted to be employed in association with, for example, an automobile anti-lock brake system (ABS) sensor, a wheel support bearing assembly utilizing such rotation detecting device and a method of making such rotation detecting device

2. Description of the Related Art

The technique has been suggested, in which a sensor and peripheral component parts are manufactured by means of an over molding (insert molding) of a resinous material. In an axle rotation sensor (an ABS sensor) used as fitted to a hub bearing assembly of an automotive vehicle, the structure is employed, in which a magnet body or a metallic body is arranged in a rotational ring of the hub bearing assembly and a magnetic sensor such as, for example, a magnetic pickup, a Hall sensor or a magnetoresistance element is arranged in a stationary ring in face-to-face relation therewith. The ABS sensor referred to above is used as a sensor unit structure with the sensor component parts over-molded.

In the conventional art, JP Laid-open Patent Publication No. 2000-88984, for example, discloses the over molding (secondary molding) of the resinous material with sensor component parts fixed to a sensor holder for fixing the sensor. In automotive vehicle component parts, such performances as the mechanical strength, the water proofing property, the weather resistance and the chemical resistance are required and, therefore, such a molding is necessary.

However, the conventional art involves the following problems.

(1) No adhesion between the covering material and the component parts built therein cannot be expected.

(2) As a result of change in ambient temperature and self-heating of electronic component parts built therein, a gap tends to occur between the covering material and the built-in component parts due to the difference in thermal expansion thereof, thus posing a problem in water proofing property.

(3) Even when an external force acts on the sensor unit molded and a plastic deformation occurs in the covering material, a gap tends to occur between the covering material and the built-in component parts, thus posing a problem in water proofing property.

(4) When an external force acts on the sensor unit molded, such force acts directly on the built-in component parts since the covering material comprised of a resinous material is less susceptible to deformation and, therefore, it will constitute a cause of breakage of the sensor unit.

(5) The covering material comprised of the resinous material lacks a vibration absorbing capability and, therefore, there is a problem in durability relative to external vibrations.

(6) With the molding by means of the conventional injection molding, a nozzle through which a molten resin flows, runners for leading the molten resin towards a cavity portion, which eventually forms a molded product, and inflow gates leading to the cavity portion are required. In order to smoothen the flow of the molten resin to thereby increase the yield, the appropriate number of pieces manufactured at one time is within the range of a few pieces to some tens pieces and thus, the number of pieces molded at one time is limited.

Also, the rotation detecting device such as, for example, the ABS sensor used as fitted to an automobile component part, particularly, the hub bearing assembly, is generally exposed to the road surface and is therefore wetted with a muddy salty water and is also placed under severe environment, in which a temperature change from some tens degree to minus some tens degree occurs. Yet, since the rotation detecting device is positioned below the suspension system, it is considerably affected by vibrations induced during the travel of the automotive vehicle. Any erroneous operation of the ABS sensor brings about a considerable influence on the vehicle traveling safety. For these reasons, lowering of the water proofing property resulting from an occurrence of a fore-mentioned gap must be avoided, which gap is caused by the poor adherence between the above described covering material and the built-in component parts and the difference in thermal expansion therebetween as well as the external force. Furthermore, even with respect to the durability against the vibrations and damage resulting from the external force, it has long been desired for an excellent one. Those keen demands cannot be fulfilled with the rotation detecting device formed by the conventional resin molding.

SUMMARY

An object of the present invention is to provide a rotation detecting device, in which the difference in thermal expansion resulting from the self-heating of the sensor component parts and the environmental temperature can be absorbed, which has an excellent water proofing property, in which even when vibrations and/or external forces acts, damage to the sensor component parts can be avoided, allowing it to have an excellent durability, and in which the cost of manufacture can be reduced, and also to provide a wheel support bearing assembly equipped with such rotation detecting device and a method of manufacturing the rotation detecting device.

The rotation detecting device of the present invention includes a magnetic sensor arranged in face-to-face relation with a metallic body or magnet body provided in a rotational member; and peripheral component parts electrically or mechanically connected with the magnetic sensor, in which the magnetic sensor and the peripheral component parts are molded together so as to be covered by a thermoplastic elastomer or a material capable of exhibiting a rubber elasticity.

According to this construction, since the magnetic sensor and the peripheral component parts (which are often referred to as sensor component parts) are molded with a covering material made of the thermoplastic elastomer or the material capable of exhibiting the rubber elasticity so as to be covered thereby, even when vibrations and/or external forces act on the sensor component parts, the covering material having the rubber elasticity deforms to absorb the vibrations and/or the external forces and accordingly, it is possible to avoid inconveniences such as breakage of the sensor component parts. Also, molding to cover the sensor component parts with the elastic molding material is effective to allow the elasticity of the covering material to absorb the difference in thermal expansion even where, by the effect of the environmental temperature and the self-heating of electronic component parts, different thermal expansions occur in the sensor component parts and the covering material. Accordingly, it is possible to avoid an ingress of water or the like in between the sensor component parts and the covering material, thus allowing the sensor component parts to have a water proofing property.

In the present invention, an electric terminal of the magnetic sensor or a metallic electrode, which is one of the peripheral component parts electrically connected with the electric terminal, and the thermoplastic elastomer or the material capable of exhibiting the rubber elasticity are preferably sealingly bonded together by the molding. Here, the term "sealingly bonded" referred to above and hereinafter is intended to mean that members are bonded together and those members are liquid-tightly sealed as a result of such bonding achieved.

According to this construction, since the electric terminal of the magnetic sensor or the metallic electrode, which is one of the peripheral component parts electrically connected with the electric terminal, and the thermoplastic elastomer or the material capable of exhibiting the rubber elasticity are sealingly bonded together by the molding, it is possible to secure the water proofing property.

In the present invention, a fixture, made of a metallic material, for positioning the magnetic sensor and the peripheral component parts is preferably provided so that the magnetic sensor, the peripheral component parts and the fixture can be molded together so as to be covered by the thermoplastic elastomer or the material capable of exhibiting the rubber elasticity.

According to this construction, the use of the fixture having an affinity to adhere to the rubber material allows the sensor component parts in their entirety to have a robust structure and, also, allows the rubber material and the fixture to be firmly sealed together and, therefore, the water proofing performance is also excellent.

In the present invention, a fixture, made of a metallic material, for positioning the magnetic sensor and the peripheral component parts and a connecting member for integrally connecting the magnetic sensor and the fixture together may be provided so that the magnetic sensor, the peripheral component parts, the fixture and the connecting member can be molded together so as to be covered by the thermoplastic elastomer or the material capable of exhibiting the rubber elasticity.

According to this construction, the use of the structure, in which the fixed component parts and other sensor component parts (excluding the connecting member) are fixed by the connecting member which is another positioning member is effective to facilitate the positioning of the magnetic sensor and the fixed component parts, thereby to prevent deformation of the sensor assembly during the molding and to accurately position the various members relative to each other.

In the present invention, the fixture, made of a metallic material, for positioning the magnetic sensor and the peripheral component parts and a cable clamp affixed to the fixture for holding a cable made of a metallic material and electrically connected with the magnetic sensor are preferably employed so that the magnetic sensor, the peripheral component parts and the cable clamp may be molded together so as to be covered by the thermoplastic elastomer or the material capable of exhibiting the rubber elasticity.

With the conventional art, it often occurs that during assemblage of the sensor, there is a high risk that the cable electrically connected with the sensor may be excessively pulled under tension. Whereas, according to the above-mentioned construction, when at least a portion of the fixture parts for positioning the magnetic sensor are made of the metallic material having an affinity to bond to the rubber material and this metallic body is allowed to have a function of a cable clamp for holding the cable, firm and integral molding of the magnetic sensor and the cable together can be achieved. Where that portion of the fixture parts for fixing the sensor component parts is provided with the function of the cable clamp, firm and integral molding of the magnetic sensor and the cable can be achieved. Where that portion of the fixture parts for fixing the sensor component parts is provided with the function of the cable clamp, it is possible to suppress an increase of the number of component parts thereby to simplify the structure and also to reduce the number of manufacturing steps. Accordingly, it is advantageous in that the cost of manufacture can be reduced. Mechanical holding of the cable with the cable clamp made of the metallic material is effective to prevent the cable from being tensioned with an excessive force during the assemblage of the sensor.

In the present invention, when the thermoplastic elastomer or the material capable of exhibiting the rubber elasticity for covering the cable forming a part of the peripheral component parts and electrically connected with the magnetic sensor is externally pressed, the thermoplastic elastomer or the material capable of exhibiting the rubber elasticity and an outer skin of the cable are preferably tightly sealed together.

According to this construction, since the thermoplastic elastomer or the material capable of exhibiting the rubber is externally pressed, the thermoplastic elastomer or the material capable of exhibiting the rubber elasticity and an outer skin of the cable for supplying an input electric power to the magnetic sensor or a signal output from the magnetic sensor can be tightly sealed together. Accordingly, the water proofing property between the outer skin of the cable and the covering material can be increased.

In this respect, it is preferable to provide a fixture, made of a metallic material, for positioning the magnetic sensor and the peripheral component parts and a press-fixing member for externally pressing the thermoplastic elastomer or the material capable of exhibiting the rubber elasticity, which covers the cable. According to this construction, it is possible to provide the rotation detecting device, in which the rubber material and the outer skin of the cable are sealed tightly at all times. Accordingly, handling for mounting of this rotation detecting device can be simplified and as a result, the number of manufacturing steps can be reduced.

In the present invention, it is preferable to provide the fixture, made of a metallic material, for positioning the magnetic sensor and the peripheral component parts, and an annular cable sealing member which is capable of being plastically deformed in a direction radially inwardly thereof and provided on an outer periphery of a cable, which is one of the peripheral components, electrically connected with the magnetic sensor with a gap intervening therebetween. In this case the magnetic sensor, the peripheral component parts, the fixture and the cable sealing member are molded together so as to be covered by the thermoplastic elastomer or the material capable of exhibiting the rubber elasticity and also, the cable sealing member is plastically deformed in a direction radially inwardly thereof together with a portion of the thermoplastic elastomer or the material capable of exhibiting the rubber elasticity, which portion covers an outer peripheral portion of the cable.

According to this feature, after the sensor component parts have been integrally molded with the thermoplastic elastomer or the material capable of exhibiting the rubber elasticity, the cable sealing member is plastically deformed in a direction radially inwardly thereof together with the thermoplastic elastomer or the material capable of exhibiting the rubber elasticity and therefore, it is possible to deform in a tight condition the thermoplastic elastomer or the material capable of exhibiting the rubber elasticity around the outer skin of the cable. Accordingly, the water proofing property between the outer skin of the cable and the covering material can be increased.

In the present invention, a ring member is preferably provided on an outer periphery of the thermoplastic elastomer or the material capable of exhibiting the rubber elasticity. This ring member is operable to hold the thermoplastic elastomer or the material capable of exhibiting the rubber elasticity and a cable covering for covering a cable in a fastened state, which cable forms one of the peripheral component parts and electrically connected with the magnetic sensor.

According to this feature, after the sensor component parts have been integrally molded with a covering material made of the thermoplastic elastomer or the material capable of exhibiting the rubber elasticity, the covering material and the cable covering are held in the fastened state by means of the ring member, and therefore, the covering material can be deformed to enhance the adherence between the covering material and the cable covering to thereby increase the water proofing property between the cable covering and the covering material. In particular, since the thermoplastic elastomer or the rubber material having a highly elastically deformable capability is employed for the covering material, it can be simply deformed by the ring member to increase the adherence with the cable covering and, therefore, the water proofing property can easily be increased.

The method of manufacturing the rotation detecting device according to the present invention includes a step of loading a magnetic sensor to be arranged in face-to-face relation with a magnet body or a metallic body provided on a rotational member, peripheral component parts electrically or mechanically connected with the magnetic sensor and a thermoplastic elastomer or a material capable of exhibiting a rubber elasticity into a mold assembly and a step of compressive molding the magnetic sensor and the peripheral component parts so as to be covered by the thermoplastic elastomer or such elastic material within the mold assembly.

According to this manufacturing method, since the sensor component parts are compressively molded with the thermoplastic elastomer or the material capable of exhibiting the rubber elasticity, even when vibration and/or an external force acts on the sensor component parts, such inconveniences as, for example, breakage of the sensor component parts can be avoided and, also, the durability of the sensor component parts can be increased. When the sensor component parts are compressively molded particularly with the rubber material or the elastomer material having an elasticity, it is effective to allow the elasticity of the covering material to absorb the difference in thermal expansion even where by the effect of the environmental temperature and the self-heating of electronic component parts different thermal expansions occur in the sensor component parts and the covering material. Accordingly, it is possible to avoid an ingress of water or the like in between the sensor component parts and the covering material, thus allowing the sensor component parts to have a water proofing property. Since the molding is practiced by a compressively molding within the mold assembly, a substantial number of the rotation detecting devices can be manufactured at one cycle of molding. Therefore, according to the manufacturing method of the present invention, as compared with the conventional art utilizing the injection molding, the cost of manufacture can be reduced.

In the present invention, the mold assembly referred to above may include an upper mold and a lower mold, in which case the compressive molding step includes the substeps of intervening and sandwiching the magnetic sensor, the peripheral component parts and the rubber material mixed with a vulcanizing agent between the upper mold and the lower mold; heating at least one of the upper mold and the lower mold; and subsequent to the previous substep, applying a pressure between the upper mold and the lower mold.

According to this manufacturing method, in the first place, the magnetic sensor, the peripheral component parts and the rubber material mixed with the vulcanizing agent are intervened and sandwiched between the upper mold and the lower mold. Subsequently, at least one of the upper mold and the lower mold is heated to soften the rubber material. Thereafter, a pressure is applied between the upper mold and the lower mold. Therefore, it is possible to avoid any undesirable breakage which would occur when the magnetic sensor and the peripheral component parts are pressed by the hard rubber.

In the present invention, the compressive molding step may include the substeps of intervening and sandwiching the magnetic sensor, the peripheral component parts and the thermoplastic elastomer or the material capable of exhibiting the rubber elasticity between the upper mold and the lower mold; heating at least one of the upper mold and the lower mold; and subsequent to the previous substep, applying a pressure between the upper mold and the lower mold to allow the following three elements to be sealingly bonded together by vulcanization, an electric terminal of the magnetic sensor or a metallic electrode forming one of the peripheral component parts and electrically connected with the electric terminal, the thermoplastic elastomer or the material capable of exhibiting the rubber elasticity, or a fixture, made of a metallic material, for positioning the magnetic sensor and the peripheral component parts, and the material capable of exhibiting the rubber elasticity.

According to this manufacturing method, since the electric terminal of the magnetic sensor or the metallic electrode, and the thermoplastic elastomer or the material capable of exhibiting the rubber elasticity are sealingly bonded together by vulcanization, it is possible to secure the water proofing property.

In the present invention, the mold assembly may include an upper mold and a lower mold, in which case during the step of applying the pressure for the compressive molding step, an excessive portion of the material is preferably expelled to the outside of the mold assembly through a gap formed beforehand between the upper mold and the lower mold.

According to this manufacturing method, in the first place the magnetic sensor, the peripheral component parts, the fixture, the connecting member and the rubber material mixed with the vulcanizing agent are intervened and sandwiched between the upper mold and the lower mold. During the application of the pressure to an object to be pressed after the rubber material has been softened, the excessive material is expelled to the outside of the mold assembly through the gap formed beforehand between the upper mold and the lower mold. Accordingly, it is possible to avoid formation of shrinkage cavities in the inside, which would otherwise result from an insufficient amount of the rubber material. It is also possible to avoid such inconveniences that, due to an conversely excessive amount of the rubber material, the rubber material cannot be sufficiently accommodated within the mold assembly and, hence, no sufficient molding can be accomplished.

The wheel support bearing assembly of the present invention is for supporting a vehicle wheel rotatably relative to a vehicle body structure and includes an outer member having double row rolling surfaces formed in an inner periphery thereof; an inner member having an outer periphery formed with rolling surfaces in face-to-face relation with the rolling surfaces in the outer member; double row rolling elements interposed between the opposed rolling surfaces; and a rotation detecting device of the present invention, which is fitted to one of the outer and inner members which serves as a stationary member. The magnet body or the metallic body confronting the magnetic sensor of the rotation detecting device is fitted to the other of the outer and inner members which serves as a rotational member.

The wheel support bearing assembly is generally used under the severe environment where, for example, the automotive vehicle is exposed to the road surface and is often wetted with a muddy saline water and affected by a considerable change in temperature as hereinbefore discussed. According to the wheel support bearing assembly equipped with the rotation detecting device of the structure as hereinabove described, the various effects afforded by the rotation detecting device of the present invention can be effectively obtained; the difference in thermal expansion resulting from the ambient temperature and the self-heating of the sensor component parts can be absorbed; an excellent waterproofing capability can be exhibited; any possible damage to the sensor component parts can be avoided even when vibration and/or an external force act. Therefore, the durability is improved while the cost of manufacture can be reduced.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

DETAILED DESCRIPTION OF THE PREFERRED EMBODIMENTS

Figure 1:
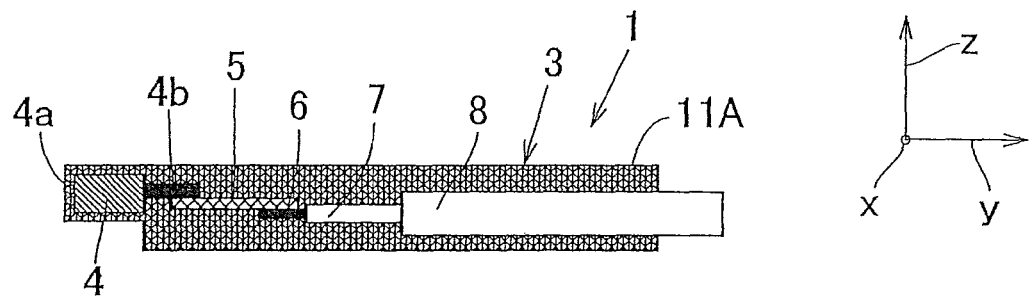
FIG. 1 is a longitudinal sectional view showing a rotation detecting device according to a first preferred embodiment of the present invention.

Hereinafter, the present invention will be described in detail in connection with some preferred embodiments thereof with reference to the accompanying drawings. In the description that follows, component parts, which are employed in one of the preferred embodiments and are similar to those described in connection with the preferred embodiment described preceding such one of the embodiments, will be designated by like reference numerals employed in such preceding embodiment and the details thereof will not therefore be reiterated. Where only portions of the structure are described, the remaining portions of the structure are to be understood similar to those described in connection with the preceding embodiment. Not only can specific portions, which have been described in connection with each of the various embodiments, be combined, but respective portions of those embodiments can also be combined with each other.

A rotation detecting device according to a first preferred embodiment of the present invention may be applied to, for example, an automobile anti-lock brake system (ABS) sensor. It is, however, to be noted that it may not necessarily be limited to the use in an automotive vehicle, but may be used in various vehicles such as, for example, motorcycles, railroad vehicles and transport vehicles and also in various bearing assemblies and components peripheral to each bearing assembly. The following description includes that of a method of making the rotation detecting device.

FIG. 1 illustrates a sectional view of the rotation detecting device according to the first preferred embodiment of the present invention. The rotation detecting device 1 shown therein includes a sensor assembly 3 and an elastic member 11A covering an important portion of the sensor assembly 3. The sensor assembly 3 has a sensor 4 which is a magnetic sensor, an electrode terminal 5, cable core lines 6, cable insulating sheathes 7 and a cable covering 8. The sensor 4 is realized in the form of a Hall sensor, a magnetoresistance element (MR sensor), a giant magnetoresistance element (GMR sensor) or a magnetic sensor made up of a coil.

The sensor 4 referred to above may be of a type including a plurality of arrayed magnetic detecting elements and designed to generate a predetermined multiplication of outputs based on an internal signal generated by calculating respective outputs of those plural magnetic detecting elements. The use of the sensor having the multiplying function is effective to provide a rotation detection resolution, which is several to several tens times the pattern formed in a magnetic encoder or the like forming an object to be detected.

The sensor 4 has a tip portion 4a arranged in face-to-face relation with and spaced a predetermined small distance from a metallic body or a magnet body provided on a rotational member (not shown). The magnet body referred to above represents, for example, a magnetic encoder magnetized alternately in a direction circumferentially thereof. The metallic body referred to above represents, for example, a gear shaped pulsar ring. The sensor 4 has a base end portion having an electric terminal 4b attached thereto, which terminal 4b has an electrode terminal 5, made of metal having a good electroconductivity, connected electrically thereto by means of a press-bonding, soldering or any other connecting method. The directions, in which the electric terminal 4b and the electrode terminal 5 extend, is hereinafter defined as a y direction and the direction of thickness of the electrode terminal 5 is defined as a z direction. A direction perpendicular to each of the y and z directions is defined as an x direction. In each of those figures, the x, y and z directions are designated by reference characters x, y and z, respectively.

The cable core line 6 is electrically connected with the y direction tip of the electrode terminal 5 by means of press-bonding, soldering or any other connecting method and the cable insulating sheath 7 is provided for electrically insulating the cable core line 6. Also, the cable covering 8 is provided for covering an exterior of the cable insulating sheath 7. The cable core lines 6, the cable insulating sheathes 7 and the cable covering 8 form a cable. Except for the sensor 4, the electrode terminal 5, the cable core lines 6, the cable insulating sheathes 7 and the cable covering 8 correspond to "peripheral component parts".

The elastic member 11A is made of a material capable of exhibiting a rubber elasticity, for example, a rubber material 11 mixed with a vulcanizing agent. This elastic member 11A covers the sensor 4, the electrode terminal 5, the cable core lines 6 and the cable insulating sheathes 7 tightly and with no gap formed therebetween. Also, this elastic member 11A is so structured as to cover the cable covering 8, except for a y direction end thereof, tightly and with no gap formed therebetween. Here, the electric terminal 4b of the sensor 4 or the electrode terminal 5 electrically connected with such electric terminal 4b, the cable core line 6 and the previously described material exhibiting the rubber property may be bonded and sealed together by means of vulcanization with the use of a mold assembly as will be described later.

The rubber material 11 is preferably in the form of, for example, nitrile rubber or a fluorine rubber because of its excellent heat resistance, low temperature property and oil resistance, but may be in the form of any other rubber material. A thermoplastic elastomer may supersede those rubber materials. Of them, chloroethenes, esters or amides, which are excellent in heat resistance and oil resistance, are preferred. Any of those material for molding the sensor assembly 3 may suffice if it is a material capable of exhibiting a rubber elasticity, and may be of a type capable of being compressively molded in the mold assembly as will be described later with reference to FIGS. 3 and 4.

Figure 2A:
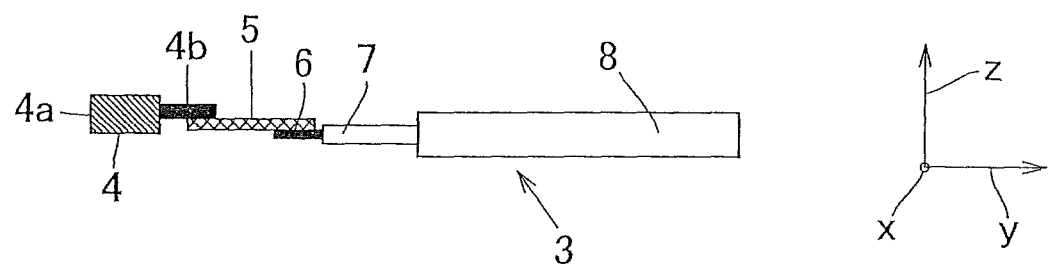
FIG. 2A is a longitudinal sectional view of a sensor assembly of the first preferred embodiment.
Figure 2B:
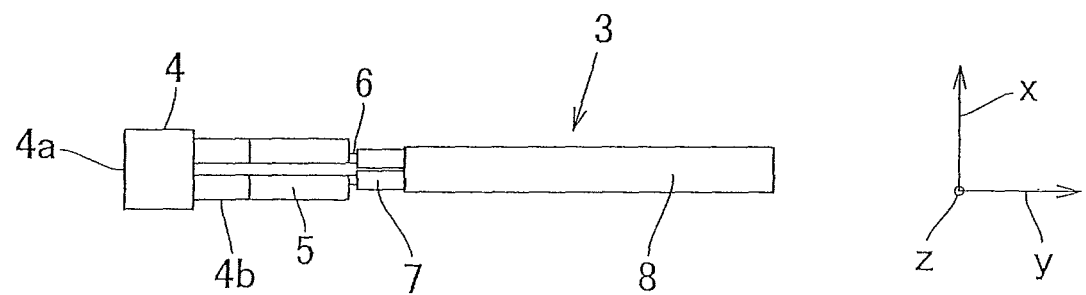
FIG. 2B is a top plan view of the sensor assembly.
Figure 3:
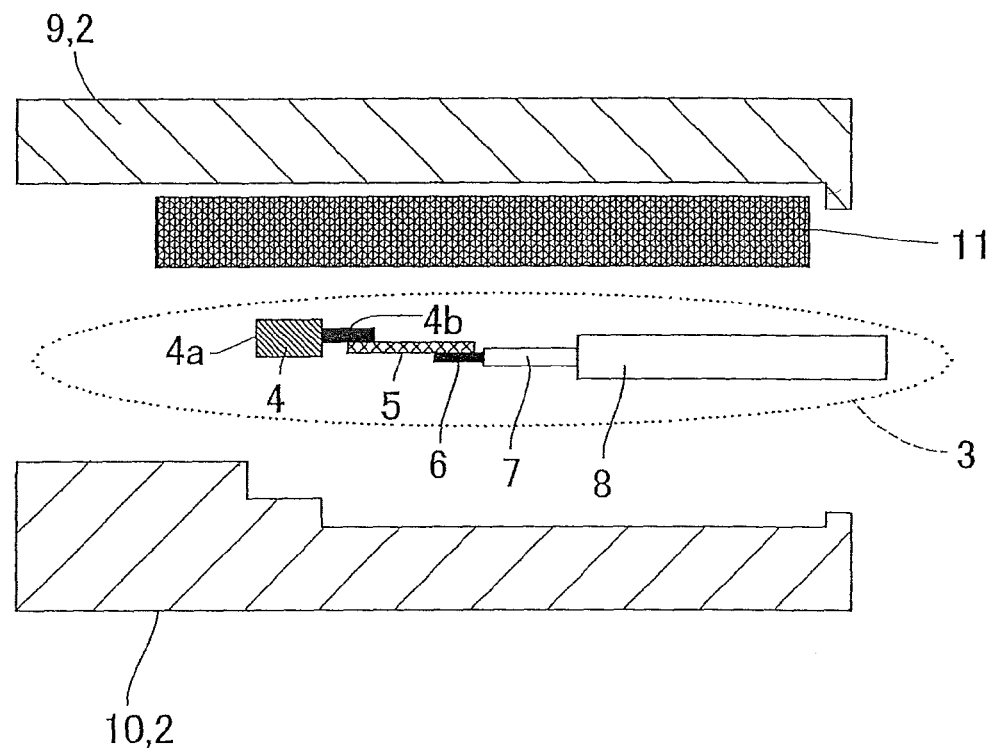
FIG. 3 is a longitudinal sectional view, showing a stage taking place before a compressive molding with the use of a mold assembly including an upper mold, a lower mold and a rubber material for formation of the sensor assembly.
Figure 4:
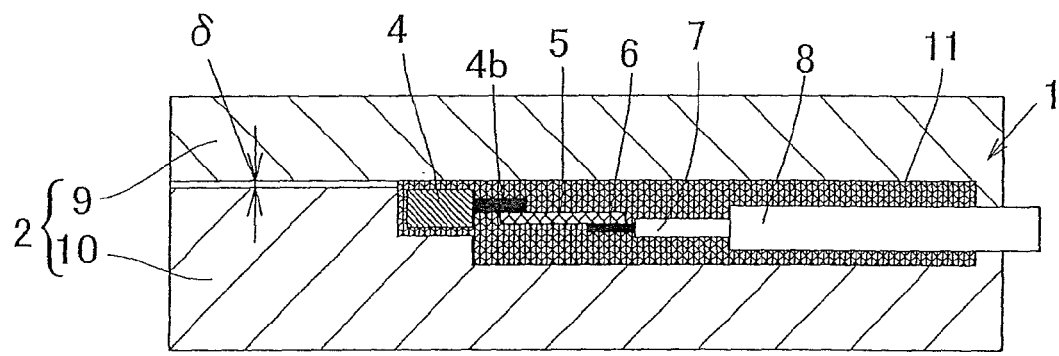
FIG. 4 is a longitudinal sectional view, showing a condition in which the sensor assembly and the rubber material are intervened and sandwiched between the upper mold and the lower mold.
Figure 4:
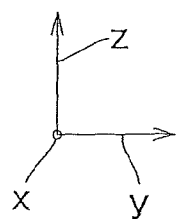

FIG. 2 is a diagram showing the sensor assembly 3, in which FIG. 2A is a sectional view of the sensor assembly 3 and FIG. 2B is a top plan view of the sensor assembly 3. FIG. 3 is a sectional view showing the stage taking place before a compressive molding accomplished by the use of the mold assembly 2 for the sensor assembly 3 including an upper mold 9, a lower mold 10 and the rubber material 11. FIG. 4 is a sectional view showing a condition, in which the sensor assembly 3 and the rubber material 11 are interposed and sandwiched between the upper mold 9 and the lower mold 10. The description will proceed with reference to FIG. 1, too.

The sensor assembly 3 referred to hereinabove is molded with the rubber material 11 mixed with the vulcanizing agent by the use of the mold assembly 2, having been sandwiched between the upper mold 9 and the lower mold 10. In other words, as shown in FIG. 3, the sensor assembly 3 is sandwiched between the upper mold 9 and the lower mold 10 together with the rubber material 11 mixed with the vulcanizing agent, and, then, while the sensor assembly 3 is completely sandwiched between and by the upper mold 9 and the lower mold 10, the upper mold 9 and the lower mold 10 are heated for a predetermined length of time, followed by compressive molding with a pressure applied to the sensor assembly 3.

In such case, if the pressure is applied to the sensor assembly 3 prior to the heating, there is the possibility that electronic component parts including the sensor 4 may be damaged, and, accordingly, application of the pressure is preferably carried out when the rubber material 11 is softened by means of a preheating. In other words, since in the embodiment now under discussion, the rubber material 11 is softened by heating the upper mold 9 and the lower mold 10 and the pressure is subsequently applied between the upper mold 9 and the lower mold 10, it is possible to prevent the electronic component parts, including the sensor 4, from being pressed to breakage by a hard rubber.

The mold assembly that can be employed in the practice of the present invention is not necessarily limited to that made up of the upper and lower molds, but any type of mold assembly including upper and lower molds can be effectively employed. In the illustrated embodiment, both the upper mold 9 and the lower mold 10 are heated for a predetermined length of time, but depending on the atmospheric temperature and the length of time passed subsequent to completion of the previous cycle of heating, it may occur that only one of the upper mold 9 and the lower mold 10 is heated for a predetermined length of time. The length of heating time over which the mold assembly 2 is heated is not always limited to that predetermined length of time that passes continuously, but the heating may be performed intermittently. Also, only the electric terminal 4b of the sensor 4 or the electrode terminal 5 connected electrically with such electric terminal 4b, the cable core line 6 and the rubber material 11 may be sealingly bonded together by vulcanization with the use of the mold assembly 2.

Also, since only a predetermined capacity is available between the upper mold 9 and the lower mold 10, there is the possibility that if the amount of the rubber material is too small, shrinkage cavities may be formed inside the elastic member and, conversely, if the amount of the rubber material is too large, the rubber material may not be satisfactorily accommodated within the mold assembly 2, thus failing to achieve the intended molding. In view of this, a gap 6 (See FIG. 4.) is preferably formed for expelling an excessive rubber material 11 therethrough to the outside of the mold assembly 2 at the stage in which the pressure is applied to the sensor assembly 3 forming an object to be pressed.

In the first embodiment described above, the upper mold 9 and the lower mold 10 are so structured as to form a predetermined minute gap 6 between the upper mold 9 and the lower mold 10 in a condition in which the pressure is applied to a predetermined object to be pressed. By so designing, at the state in which the pressure is applied to the sensor assembly 3 forming an object to be pressed, it is possible to allow the excessive rubber material 11 to be discharged smoothly to the outside of the mold assembly 2. Accordingly, it is possible to avoid formation of shrinkage cavities inside the elastic member, which would otherwise result from the use of the rubber material 11 in a small quantity. It is possible to avoid such an inconvenience that if conversely the amount of the rubber material 11 is large, the rubber material 11 cannot be accommodated within the mold assembly 2 and the molding cannot therefore be accomplished satisfactorily.

According to the rotation detecting device 1 and the method of making the same in accordance with the first embodiment hereinabove described, since the sensor assembly 3 is formed by molding the material 11 capable of exhibiting a rubber elasticity or the thermoplastic elastomer, the durability of the sensor assembly 3 can be increased. Even when vibration and/or an external force acts on the sensor assembly 3, such an inconvenience as breakage can be prevented. Even when different thermal expansions occur in the sensor assembly 3 and the elastic member 11A forming a molded material, respectively, such thermal expansions can be absorbed by the elasticity of the elastic member 11A. Accordingly, it is possible to avoid formation of an undesirable gap between the sensor assembly 3 and the elastic member 11A, allowing the sensor assembly 3 to exhibit a water proofing property. Since the molding is accomplished by the compressive molding with the use of the mold assembly, a substantial number of rotation detecting devices 1 can be manufactured at one molding work. Accordingly, as compared with the conventional rotation detecting device formed by the use of an injection molding, it is possible to achieve a reduction of the production cost of the rotation detecting device 1 per unit time.

The first embodiment of the present invention shown in and described with reference to FIGS. 1 to 4 includes the following modes 1 to 3 of embodiment:

Mode 1:

In the present invention, the magnetic sensor is preferably in the form of a Hall sensor, a magnetoresistance element or a giant magnetoresistance element.

Mode 2:

In the present invention, the magnetic sensor may be so structured as to be a magnetic sensor including a coil.

Mode 3:

In the present invention, the magnetic sensor is preferably so structured as to be fitted to a wheel support bearing assembly for an automotive vehicle.

Mode 4:

In the present invention, the magnetic sensor is preferably of a type including a plurality of arrayed magnetic detecting elements and designed to generate a predetermined multiplication of outputs based on an internal signal generated by calculating respective outputs of those plural magnetic detecting elements.

According to those modes of embodiments, automobile component parts having performances such as, for example, mechanical strength, water proofing property, weather resistance and chemical resistance can be realized.

Hereinafter, the rotation detecting device according to a second preferred embodiment of the present invention will be described in detail with particular reference to FIGS. 5, 6A and 6B. The second embodiment differs from the first embodiment shown in FIG. 1 in that the second embodiment makes use of a fixing attachment 21 as a fixture and even this fixing attachment 21 is also covered by the elastic member 11A, noting that other structural features than that described above are similar to those shown and described in connection with the first embodiment.

Figure 5:
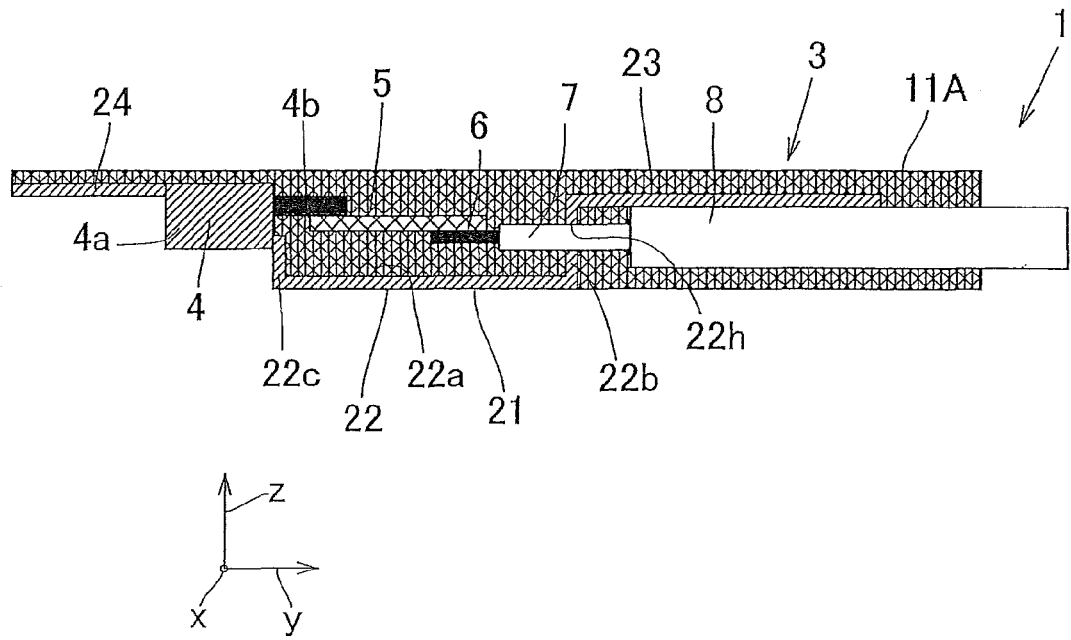
FIG. 5 is a longitudinal sectional view showing the rotation detecting device according to a second preferred embodiment of the present invention.

FIG. 5 illustrates a sectional view of the rotation detecting device according to the second embodiment of the present invention. In FIG. 5, the fixing attachment 21 is made of a metallic material such as, for example, steel, aluminum, copper or brass, of a kind having an affinity to bond with the rubber material. In consideration of the corrosion resistance, the use of an austenitic stainless steel, a steel having been surface treated with zinc base alloy or an alumite treated aluminum is preferred. It is, however, to be noted that the metallic material that can be employed is not necessarily limited thereto. The fixing attachment 21 has a function of positioning the sensor 4 and the peripheral component parts. The fixing attachment 21 includes, mainly, a recessed portion 22 representing a concaved shape as viewed from side, a cable fixing portion 23 formed integrally with one side edge of the recessed portion 22 and a sensor fitting portion 24 formed integrally with the opposite side edge of the recessed portion 22 and utilizable to position the sensor 4 in the y-direction. The wording "as viewed from side" referred to above is analogous to view the sensor assembly 3 in the x direction.

Of the fixing attachment 21, the recessed portion 22 is disposed generally intermediate of the sensor assembly 3 in the longitudinal direction. The recessed portion 22 is made up of a bottom area 22a, a first wall area 22b including that one side edge, and a second wall area 22c including that opposite side edge. The elastic member 11A is fixed on one surface portion of the bottom area 22a, with the opposite surface portion of the bottom area 22a exposed to the outside (in other words, no elastic member 11A is fixed). The first wall area 22b extends from one end of the bottom area 22a in the y direction and is formed to be parallel to an xz plane (the imaginary plane parallel to the x direction and the z direction), and is formed with a hole 22h for passage of the cable insulating sheath 7 therethrough to support the latter.

The cable fixing portion 23 is provided integrally with the first wall area 22b so as to extend from one side edge of the first wall area 22b in the xy plane (the imaginary plane parallel to the x and y directions). The elastic member 11A is fixed on one surface area of the cable fixing portion 23 and the cable covering 8 is fixed on a major portion of the opposite surface area of the cable fixing portion 23. The first wall area 22b of the recessed portion 22 cooperates with the cable fixing portion 23 to fixedly position and support the cable and others.

The second wall area 22c is formed so as to stand from and be spaced a predetermined small distance from the opposite end of the bottom area 22a in the y-direction. The second wall area 22c has one side edge continuing to the opposite end of the bottom area 22a and the other side edge on the opposite side in the z-direction. The sensor fitting portion 24 is provided integrally with the second wall area 22c so as to extend along the shape of an appearance of the sensor 4 from the other side edge of the second wall area 22c. The sensor 4 is so formed as to represents an oblong shape as viewed from side and a rectangular shape as viewed from top. The wording "viewed from top" referred to above is analogous to view the sensor assembly 3 in the z direction. The elastic member 11A is fixed on one surface portion of the second wall area 22c with the other surface portion of the second wall area 22c exposed to the outside. The elastic member 11A is fixed on one surface area of the sensor fitting portion 24, with the other surface area of the sensor fitting portion 24 exposed to the outside. As hereinabove described, the fixing attachment 21 positions the sensor 4 and the peripheral component parts.

Figure 6A:
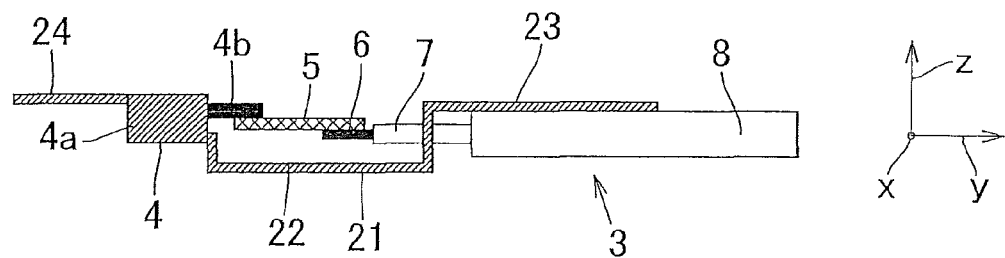
FIG. 6A is a longitudinal sectional view showing the sensor assembly employed in the practice of the second embodiment of the present invention.
Figure 6B:
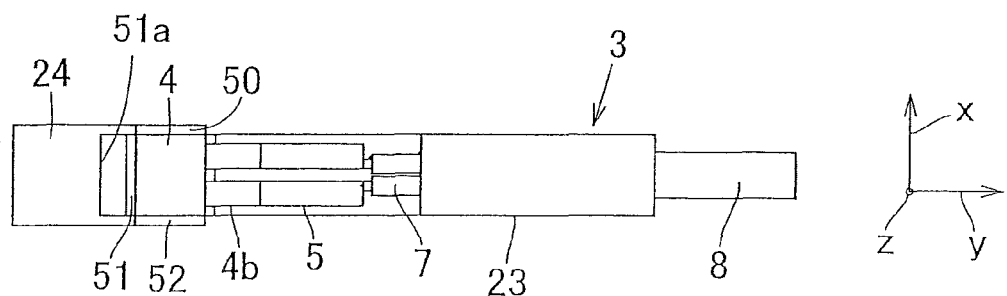
FIG. 6B is a top plan view showing the sensor assembly employed in the practice of the second embodiment of the present invention.

FIGS. 6A and 6B are diagrams of the sensor assembly 3, in which FIG. 6A is a sectional view of the sensor assembly 3 and FIG. 6B is a top plan view of the sensor assembly 3. Referring to FIGS. 6A and 6B, the fixing attachment 21 and the sensor 4 are positioned and held in contact with one side wall area 50 of the fixing attachment 21, an upright wall area 51 and a portion of an opposite side wall area 52. The side wall area 50, the upright wall area 51 and the opposite side wall area 52 are respective parts of the fixing attachment 21 and are formed integrally by bending a metal plate in the z-direction and cutting by means of a press working. Of them, the upright wall area 51 can be formed by forming a slit of a U shape as viewed from top in the fixing attachment 21 and then bending it in the z direction. The sensor 4 is positioned in the x direction by the side wall area 50 and the opposite side wall area 52 and, on the other hand, the sensor 4 is positioned in the y direction by the upright wall area 51. By allowing the rubber to enter in the rectangular hole 51a formed by forming the upright wall area 51 by means of bending, the adhesive strength of the rubber to the sensor fitting portion 24 can be increased.

According to the rotation detecting device 1 according to the second embodiment of the present invention as described hereinabove, the use of the fixing attachment 21 having an affinity to bond with the rubber material 11 makes it possible for the sensor assembly 3 as a whole to be easily formed as a firm structure. Accordingly, when the sensor assembly 3 and the rubber material 11 are compressive molded in the mold assembly 2, there is no possibility of the relative position of the component parts of the sensor assembly 3 being undesirably displaced and therefore, deterioration in quality of the rotation detecting device 1 can be prevented. As a result, the yield can be increased. The use of the fixing attachment 21 having a good affinity to bond with the rubber material 11 results in a firm sealing between the rubber material 11 and the fixing attachment 21 and therefore, it can have an excellent water proofing performance.

Since owing to the fixing attachment 21 the sensor assembly 3 as a whole can have a firm structure without the structure of the sensor assembly 3 being complicated, increase of the number of the component parts of the rotation detecting device as a whole can be minimized, making it possible to reduce the number of process steps. Accordingly, the reduction in manufacturing cost can be accomplished.

The second preferred embodiment of the present invention shown in and described with reference to FIGS. 5, 6A and 6B includes the following modes 1 and 2 of embodiment.

Mode 1:

In the present invention, the fixture referred to above is preferably so structured as to be fitted to a wheel support bearing assembly for an automotive vehicle or its peripheral member. According to this construction, fitting to the wheel support bearing assembly or its peripheral member can be accomplished easily.

Mode 2:

In the present invention, the fixture and the rubber material are preferably bonded together by vulcanization. According to this construction, the adhesion between the rubber material and the fixture made of a metallic material becomes good. In particular, utilization of the adhesion of the covering material (rubber) to the metal results in a firm sealing therebetween and therefore, the rotation detecting device excellent in water proofing performance can be realized.

In the following description, the rotation detecting device according to a third preferred embodiment of the present invention will be described in detail with particular reference to FIGS. 7, 8A and 8B. This embodiment differs from the second embodiment, shown in and described with reference to FIG. 5, in that the former employs a connecting member 25, which is also covered by the elastic member 11A, and structural features other than that described above are similar to those shown and described in connection with the second embodiment.

Figure 7:
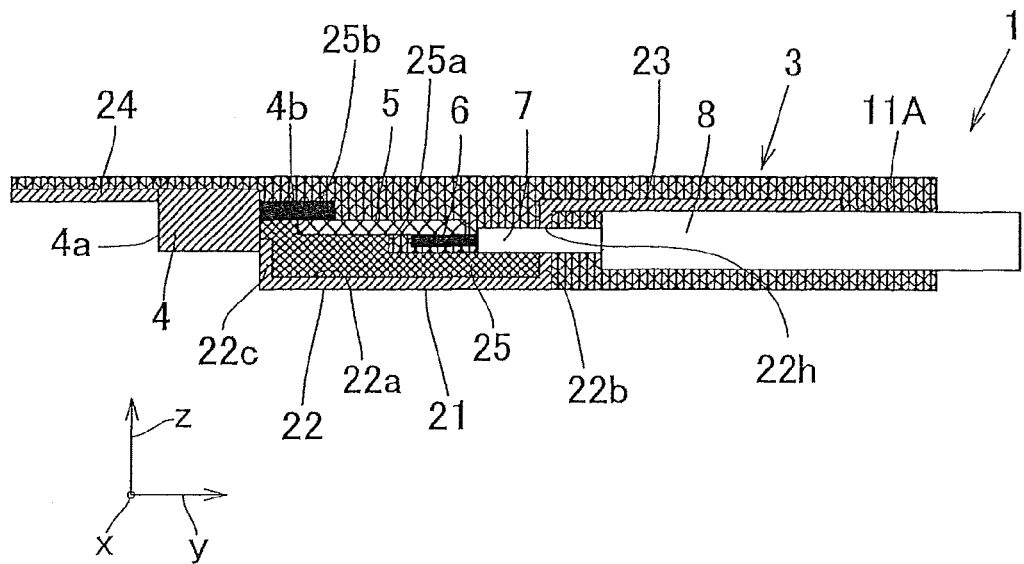
FIG. 7 is a longitudinal sectional view showing the rotation detecting device according to a third preferred embodiment of the present invention.
Figure 8A:
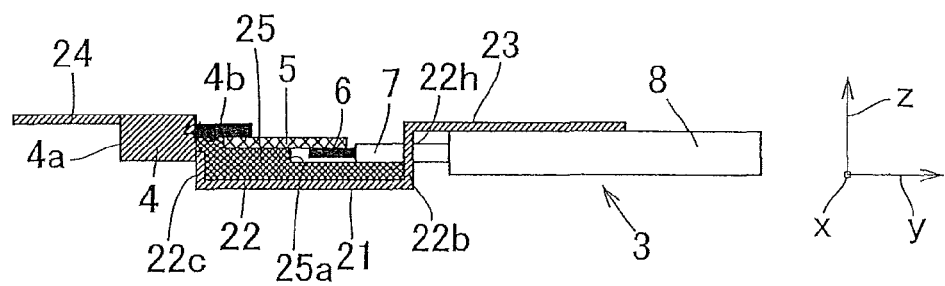
FIG. 8A is a longitudinal sectional view showing the sensor assembly employed in the practice of the third embodiment of the present invention.
Figure 8B:
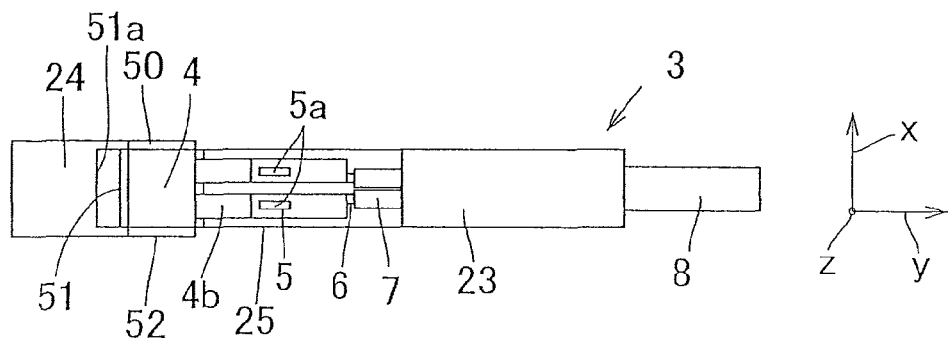
FIG. 8B is a top plan view showing the sensor assembly employed in the practice of the third embodiment of the present invention.

FIG. 7 is a sectional view showing the rotation detecting device according to the third embodiment. Referring to FIG. 7, the connecting member 25 has a rear end face fixed to the first wall area 22b at a lower portion thereof extending from a junction with one surface of the bottom area 22a to the supported cable insulating sheathes 7.

The connecting member 25 has a front end face, a lower half of which is fixed to the one surface portion of the second wall area 22c. The other surface portion of the second wall area 22c is exposed to the outside. A bottom face of the connecting member 25 is fixed to the one surface of the bottom area 22a of the recessed portion 22. The elastic member 11A is fixed on one surface portion of the sensor fitting portion 24 and the opposite surface portion of the sensor fitting portion 24 is exposed to the outside. As described in connection with the second embodiment, the fixing attachment 21 serves to position the sensor 4 and the peripheral component parts and the connecting member 25 connects at least the sensor 4 and the fixing attachment 21 integrally with each other.

The connecting member 25 is made of at least one of a plastic material, a ceramic material and a metallic material with an insulating cover. The insulating cover referred to above has a function of insulating only junctures with the electric terminal 4b of the sensor 4, the electrode terminal 5 and each cable core line 6. In other words, the connecting member 25 is designed to be a double layered structure including, for example, an insulating layer and metal (but may be a multi layered structure having three or more layers). In such case, as compared with the use of the plastic or ceramic material, in view of the effect of bonding of the metallic material and the rubber material together by vulcanization, the adhesive strength resulting from the adhesion with the rubber material (covering material) can be increased. It is, however, to be noted that the connecting member 25 may be of a type capable of withstanding the molding temperature at which the rubber material or the thermoplastic elastomer is molded.

As described above, the connecting member 25 is so structured as to represent such a shape that it is tightly fixed on the bottom area 22a of the recessed portion 22, the one surface portion of the first wall area 22b and the one surface portion of the second wall area 22c. Also, the connecting member 25 is tightly fixed to a peripheral portion of each cable insulating sheath 7 confronting the bottom area 22a and is so structured as to represent such a shape as to be tightly fixed to each cable core line 6 through the elastic member 11A. Of the connecting member 25, one surface portion parallel to the xy plane confronting the outer peripheral portion of each cable insulating sheath 7 and one surface portion parallel to the xy plane confronting the elastic member 11A corresponding to the position where the cable core line 6 is arranged are formed in a flat shape.

The connecting member 25 is tightly fixed to a surface portion of the electrode terminal 5 confronting the bottom area 22a. As shown in FIG. 8B, a pair of rectangular holes 5a spaced a predetermined small distance from each other in the x direction are formed in the electrode terminal 5, and portions of the connecting member 25 are fixedly inserted into those rectangular holes 5a. Each of the rectangular holes 5a is formed in a rectangular shape extending in the y direction. Of the connecting member 25 a portion fixed to that surface portion of the electrode terminal 5 is formed to be thicker than a portion confronting the elastic member 11A at a location of the cable core lines 6, and is also so structured as to represent a flat shape parallel to the xy plane. In other words, in the one surface portion of the connecting member 25, that surface portion confronting the elastic member 11A is formed with a first step 25a which continues to that surface portion confronting the electrode terminal 5.

Referring to FIG. 7, the connecting member 25 is tightly fixed to one surface of the electric terminal 4b confronting the bottom area 22a, and an upper portion of the front end face of the connecting member 25 is tightly fixed to the base end of the sensor 4 adjacent that one surface portion of the electric terminal 4b. Of the connecting member 25 a portion fixed to the one surface portion of the electrode terminal 4b is formed to be thicker than that portion fixed to the electrode terminal 5 and is so structured as to represent a flat shape parallel to the xy plane. In other words, in this connecting member 25, one surface portion confronting the electrode terminal 5 is formed with a second step 25b which continues to one surface portion confronting the electric terminal 4b.

As hereinabove described, the connecting member 25 is tightly fixed to a plurality of locations including the fixing attachment 21, the cable insulating sheath 7, the elastic member 11A, the electrode terminal 5, the electric terminal 4b and the sensor 4. The use of the connecting member 25 to fix the fixing attachment 21 and the sensor 4 and others makes it possible to facilitate positioning of the sensor 4 and the fixing attachment 21 relative to each other and also to accurately position the various component parts while any possible deformation of the sensor assembly 3 during the molding can be avoided. Since as shown in FIG. 8B the pair of the rectangular holes 5a spaced the predetermined small distance from each other in the x direction are formed in the electrode terminal 5 and those portions of the connecting member 25 are fixedly inserted into those rectangular holes 5a, the accuracy of positioning of particularly the electrode terminal 5 can be further increased.

According to the rotation detecting device 1 in the third embodiment of the present invention as hereinabove described, the use of the fixing attachment 21 having an affinity to bond with the rubber material 11 makes it possible for the sensor assembly 3 as a whole to be easily formed as a firm structure. Since the fixing attachment 21 and the other component parts of the sensor assembly are so designed as to be fixed by the connecting member 25, which is a different positioning member, the positioning of the sensor 4 and the fixing attachment 21 relative to each other can be facilitated, any undesirable deformation of the sensor assembly 3 during the molding can be avoided, and the various members can be accurately positioned relative to each other. Accordingly, when the sensor assembly 3 and the rubber material 11 are compressively molded within the mold assembly 2, an undesirable displacement in relative position of the component parts forming the sensor assembly 3 will not occur and any deterioration in quality of the rotation detecting device 1 can be avoided, too. Therefore, the yield can be increased.

The rotation detecting device according to a fourth preferred embodiment of the present invention will now be described in detail with particular reference to FIGS. 9, 10A and 10B. This embodiment differs from the second embodiment shown in and described with particular reference to FIG.

5 in that the former makes use of a cable clamp 26 formed by processing a portion of the fixing attachment 21, which clamp 26 is also covered by the elastic member 11A, and structural features other than those described above are similar to those shown and described in connection with the second embodiment.

Figure 9:
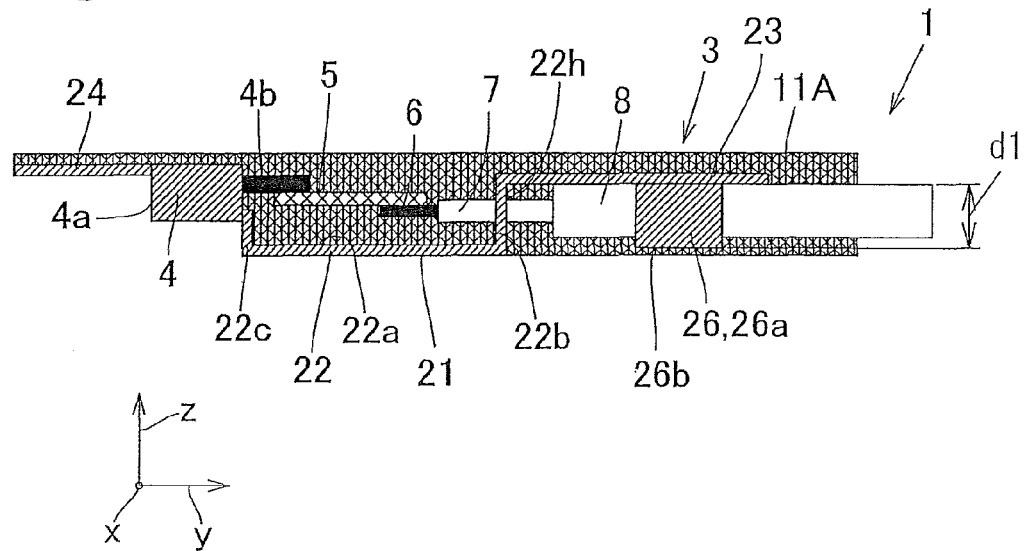
FIG. 9 is a longitudinal sectional view showing the rotation detecting device according to a fourth preferred embodiment of the present invention.

FIG. 9 illustrates a sectional view of the rotation detecting device according to the fourth preferred embodiment of the present invention. In this FIG. 9, the fixing attachment 21 has a function of positioning the sensor 4 and the peripheral component parts and is so structured as to mechanically clamp the cable core lines 6, the cable insulating sheathes 7 and the cable covering 8. The cable core lines 6, the cable insulating sheathes 7 and the cable covering 8 correspond to the cable. A portion of the cable fixing portion 23 forming a part of the fixing attachment 21 is provided with a cable clamp 26 formed integrally therewith. For example, the elastic member 11A is fixed on one surface of the cable fixing portion 23 and, in the opposite surface of the cable fixing portion 23, the cable clamp 26 is so formed by bending as to project in the z direction at a generally intermediate portion of the length thereof. It is, however, to be noted that the cable clamp 26 is not limited to subject to such bending.

The cable clamp 26 has a pair of clamps each made up of a clamp body 26a and a holder piece 26b. The pair of the clamps are arranged spaced from each other in the x direction. Each of the clamp bodies 26a is integrally formed at a portion of the opposite surface of the cable fixing portion 23 along a predetermined outer edge thereof. Each clamp body 26a is so formed along the yz plane as to protrude in the z direction from the outer edge referred to above.

Figure 10A:
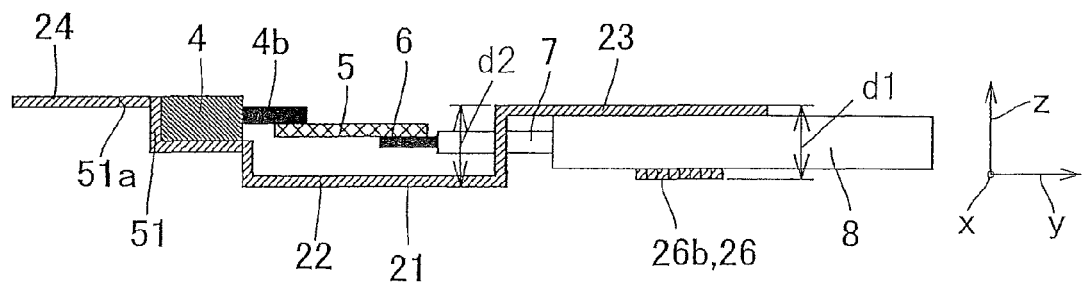
FIG. 10A is a longitudinal sectional view showing the sensor assembly employed in the practice of the fourth embodiment of the present invention.
Figure 10B:
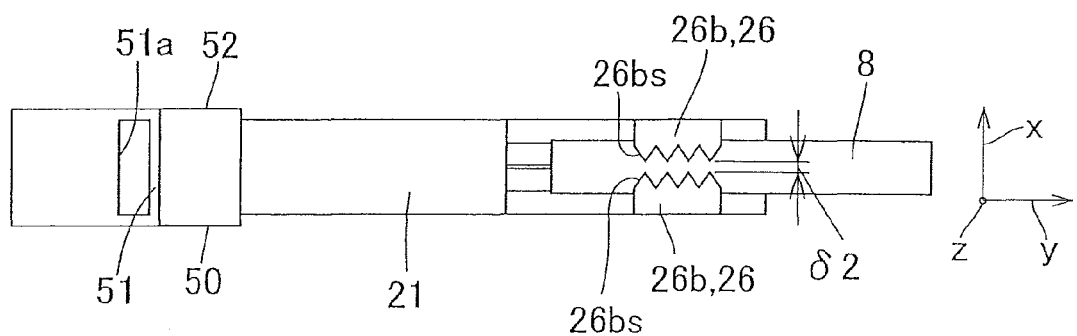
FIG. 10B is a top plan view showing the sensor assembly employed in the practice of the fourth embodiment of the present invention.

Referring now to FIGS. 10A and 10B, the holder pieces 26b for holding the cable covering 8 on the opposite surface of the cable fixing portion 23 are provided integrally so as to extend from free end portions of the clamp bodies 26a, respectively. One of the holder pieces 26b is so formed as to protrude along the xy plane in a direction towards the other of the holder pieces 26b. Those holder pieces 26b are so formed that one of the holder pieces 26b may extend along the xy plane in a direction towards the other of the holder pieces 26b. Those holder pieces 26b are so formed by bending the front end edges of the clamp bodies 26a toward opposite directions in the x direction, respectively. However, the holder pieces 26b of the present invention are not always limited to the formation by bending. Respective free ends 26bs of those holder pieces 26b are so formed as to represent a saw-toothed shape, as viewed from bottom, so that the cable covering 8 can be mechanically firmly fixed. The respective free ends 26bs are so arranged as to have a gap 62 of a predetermined small distance therebetween to allow them to be held in non-contact relation with each other.

In particular, while sawteeth at the free ends 26bs of the holder pieces 26b bite an outer surface portion of the cable covering 8, the sensor assembly 3 is compressively molded in the mold assembly in a manner covered by the rubber material 11 as will be described later and accordingly, the sensor 4 and the cable can be firmly integrally molded. In the practice of the fourth embodiment of the present invention, although the free ends 26bs of the holder pieces 26b are formed in a sawtoothed shape, the free ends 26bs of the holder pieces 26 are not necessarily limited to the sawtoothed shape. The free ends 26bs may represent, for example, a corrugated shape corrugated in the y direction, a wavy shape or any other shape combining those shapes. Even in such case, effects similar to those afforded by the fourth embodiment can be obtained.

In the fourth embodiment, though the cable clamp 26 having the pair of the clamps has been shown and described as employed, a cable clamp including only one clamp can be employed. In such case, a holder piece protruding from a free end edge of the clamp body 26a is so formed as to extend a somewhat longer in the x direction so as to cover the cable covering 8. As hereinabove described, the first wall area 22b of the recessed portion 22 and the cable fixing portion 23, particularly the cable clamp 26, cooperate with each other to position and fix the cable and others. The cable clamp 26 referred to above is tightly fixed to the elastic member 11A except for a portion thereof that holds the cable covering 8.

According to the rotation detecting device 1 according to the fourth embodiment of the present invention described hereinabove, the fixing attachment 21 as a whole, which is a member for positioning the sensor 4, is made of a metallic material having an affinity to bond with the rubber material 11, and the clamp mechanism for fixing the cable for the input electric power supply to the sensor 4 or the signal output from the sensor 4 is structured integral in this fixing attachment 21. Accordingly, the sensor 4 and the cable can be firmly molded integrally with each other. Since the mechanism for clamping the cable is provided in that portion of the fixing attachment 21, the structure can be simplified while suppressing an increase of the number of component parts of the device, making it possible to reduce the number of the manufacturing steps. Therefore, it is advantageous in reducing the production cost. Since the cable is held mechanically by the cable clamp 26 made of the metallic material, it is possible to prevent a maximum tensile force from being imposed on the cable, the electric terminal 5 connected therewith and the sensor 4 during incorporation of the sensor, thus avoiding a wire breakage or the like.

The rotation detecting device according to a fifth preferred embodiment of the present invention will hereinafter be described with particular reference to FIGS. 11 and 12. This embodiment differs from the second embodiment shown in and described with reference to FIG. 5 in that the fifth embodiment makes use of first and second press-fixing members PL1 and PL2, and structural features other than that described above are similar to those shown and described in connection with the second embodiment.

Figure 11:
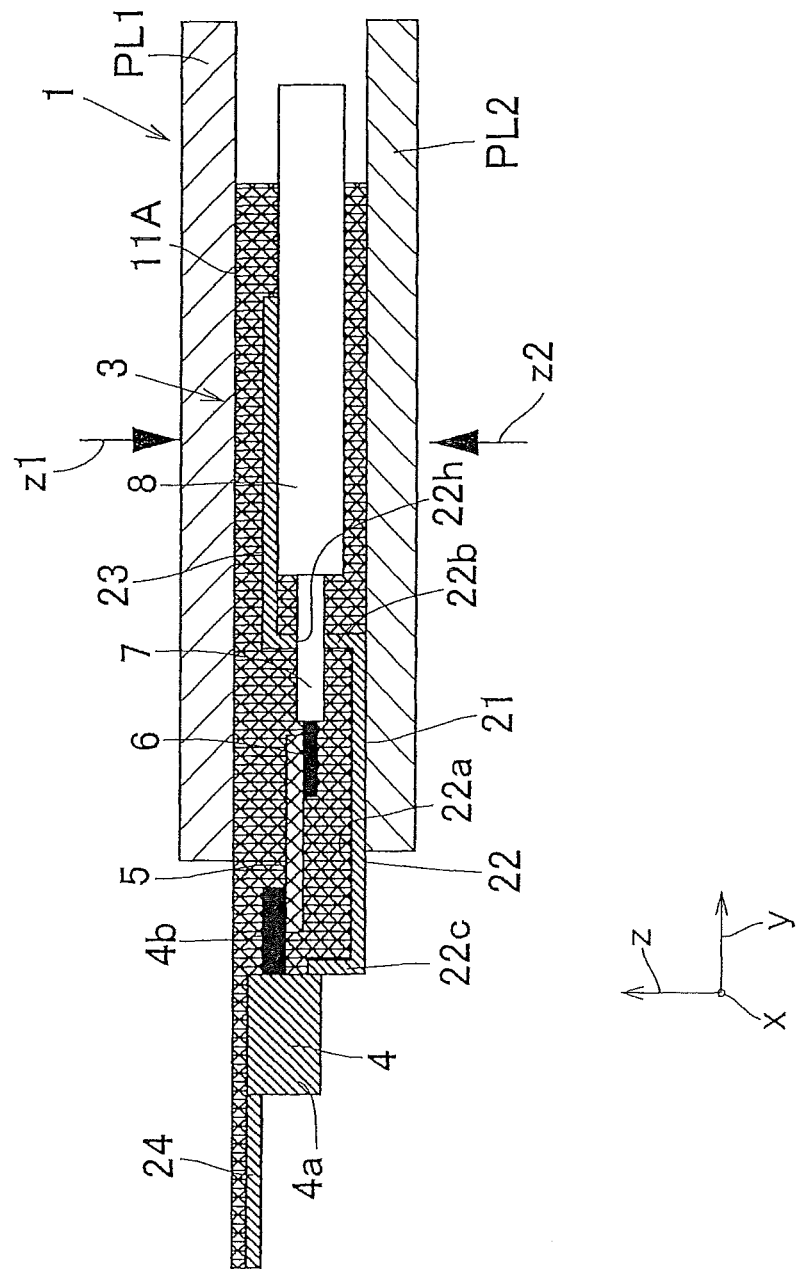
FIG. 11 is a longitudinal sectional view showing the rotation detecting device according to a fifth preferred embodiment of the present invention.

FIG. 11 illustrates a sectional view of the rotation detecting device according to the fifth embodiment. Referring to FIG. 11, a molded body including the sensor assembly 3 and the elastic member 11A is sandwiched between the first and second press-fixing members PL1 and PL2 that are arranged parallel to each other and spaced from each other in the z direction. Such molded body is subjected to a compressive force acting in directions shown by the arrows z1 and z2 (the magnitude of which is limited to such an extent that internal members will not be damaged) when it is sandwiched between the first and second press-fixing members PL1 and PL2. The first press-fixing member PL1 is made of a metallic material such as, for example, steel, aluminum, copper or brass, of a kind having a good adhesion with the rubber material. In consideration of the corrosion resistance, the use is preferred of an austenitic stainless steel, a steel having been surface treated with zinc base alloy or an alumite treated aluminum. It is, however, to be noted that the metallic material that can be employed is not necessarily limited thereto.

The first press-fixing member PL1 of that kind extends in the y-direction along the xy plane. This first press-fixing member PL1 is disposed in a surface portion of the molded body which surface portion faces in the z-direction and corresponds to the position where at least a portion of the electrode terminal 5, the cable core lines 6, the cable insulating sheathes 7, the cable fixing member 23 and the cable covering 8 are provided. One end (a rear end) of the first press-fixing member PL1 in a direction lengthwise thereof protrudes a predetermined small distance in the y direction from one end of the elastic member 11A in the y direction.

The second press-fixing member PL2 is made of the same metallic material as that used to form the first press-fixing member PL1 referred to above and extends in the y direction along the xy plane. This second press-fixing member PL2 is arranged in the opposite surface portion of the molded body which surface portion faces in the z direction and corresponds to the position where at least a portion of the opposite surface of the bottom area 22a, the cable insulating sheaths 7 and the cable covering 8 are provided. One end of the second press-fixing member PL2 in a direction lengthwise thereof protrudes a predetermined small distance in the y direction from one end of the elastic member 11A in the y direction.

The elastic member 11A between the fixing attachment 21 and the press-fixing member PL1 (PL2), in response to the compressive force acting in the z direction, generates a compressive force between the elastic member 11A and the cable insulating sheaths 7 (and the cable covering 8) that intervene therebetween. As a result thereof, the adhesion between the cable insulating sheaths 7 (and the cable covering 8) and the elastic member 11A is remarkably increased to thereby increase the water proofing property assuredly. A constraining element (not shown) may be provided for holding a z-direction gap between the first press-fixing member PL1 and the second press-fixing member PL2.

In the fifth embodiment of the present invention, the first and second press-fixing members PL1 and PL2 have been shown and described as respective members made of the same material and having the same dimension. According to this construction, the dual purpose use of component parts can be increased and the production cost of the rotation detecting device as a whole can be reduced. It is, however, that the first press-fixing member PL1 and the second press-fixing member PL2 may be made of different materials and may have different dimensions.

Although in the fifth embodiment of the present invention, the first and second press-fixing members PL1 and PL2 have been shown and described as respective members separate from each other, they may be structured integrally with each other. According to this construction, it come to be possible to precisely define the z direction dimension between the first and second press-fixing members PL1 and PL2. Accordingly, a desired compressive force can be made generated between the elastic member 11A and the cable insulating sheath 7 (and the cable covering 8) and as a result, the adhesion between the cable insulating sheath 7 (and the cable covering 8) and the elastic member 11A can be increased.

Along therewith, the number of assembling steps can be reduced as compared with that required when the press-fixing members are employed in the form of respective members separate from each other, and accordingly, the production cost of the rotation detecting device as a whole can be reduced. Also, it is possible to construct the first and second press-fixing members PL1 and PL2 so as to form a portion of a tubular member. Even in this case, a desired compressive force can be generated and the adhesion between the cable insulating sheaths 7 (and the cable covering 8) and the elastic member 11A can be increased assuredly.

Figure 12:
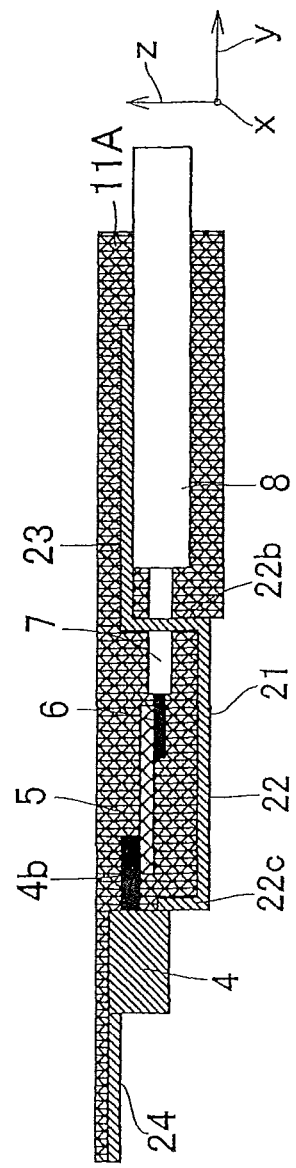
FIG. 12 is a longitudinal sectional view, showing the entire structure before the rubber material being pressed, after the compressive molding with the use of the mold assembly in the practice of the fifth embodiment of the present invention.

FIG. 12 is a sectional view showing the entire structure after the compressive molding with the use of the mold assembly, but before the rubber material is pressed. The following description is made also with reference to FIG. 11. The molded body including the sensor assembly 3 and the elastic material 11A is sandwiched and held at, for example, normal temperatures between the first and second press-fixing members PL1 and PL2 that are arranged parallel to each other and spaced from each other in the z direction. By so doing, the following effects can be obtained:

(i) The elastic member 11A between the surface portion of the bottom area 22a of the fixing attachment 21 and the first press-fixing member PL1 is subjected to the compressive force at all times.

(ii) The elastic member 11A between the surface portion of the cable fixing portion 23 and the first press-fixing member PL1 is subjected to the compressive force at all times.

(iii) The elastic member 11A between the opposite surface portion of the cable fixing portion 23 and the second press-fixing member PL2 is subjected to the compressive force at all times.

Accordingly, the adhesion between the cable insulating sheathes 7 (and the cable covering 8) and the elastic member 11A is remarkably increased to achieve a tight seal, resulting in enhancement of the water proofing property.

According to the rotation detecting device 1 to which the fifth embodiment of the present invention pertains as hereinabove described, in view of the fact that the material having a rubber elasticity or the thermoplastic elastomer covering the cable insulating sheathes 7 and the cable covering 8 are pressed externally, the thermoplastic elastomer or the material having the rubber elasticity and an outer skin of the cable are pressed together and are hence tightly sealed in contact with each other. Accordingly, the thermoplastic elastomer or the material having the rubber elasticity is deformed to enhance the water proofing property between the outer skin of the cable and the covering material.

In the practice of the fifth embodiment, although the rotation detecting device 1 including the first and second press-fixing members PL1 and PL2 has been described as fitted to the wheel support bearing assembly, the following modes of variation are also available.

(i) With the molded body (See FIG. 12.), excluding the first and second press-fixing members PL1 and PL2 from the rotation detecting device 1, having been prepared, the molded body is externally pressed by press-fixing member counterparts that are before provided in the wheel support bearing assembly or its peripheral member. In this way, the degree of adhesion between the rubber material and the outer skin of the cable can be increased to enhance the sealing performance. In such case, so that the desired compressive stress can be received when the molded body is externally pressed by the press-fixing member counterparts, it is necessary to provide the press-fixing member counterparts in a prescribed dimension. According to this construction, as compared with the rotation detecting device 1 according to the fifth embodiment, the unit price incurred by the manufacture of the device itself can be suppressed. Other effects similar to those afforded by the fifth embodiment can also be obtained.

(ii) With the molded body, including one of the first and second press-fixing members, having been prepared, the molded body may be so structured as to be fitted to the other of the press-fixing member that is provided beforehand in the wheel support bearing assembly or its peripheral member. According to this construction, the molded body itself can be constructed to have a firm structure and, as compared with (i) in the preceding paragraph, the number of steps necessary to fit it to the wheel support bearing assembly can be reduced. Other effects similar to those afforded by the fifth embodiment can also be obtained.

The rotation detecting device according to a sixth preferred embodiment of the present invention will be described hereinafter with particular reference to FIGS. 13A-13C. This embodiment differs from the second embodiment shown and described with reference to FIG. 5 in that this embodiment makes use of a cable sealing member CB, which is also covered by the elastic member 11A that is used as a covering material, and other structural features than those described above are similar to those shown and described in connection with the second embodiment.

Figure 13A:
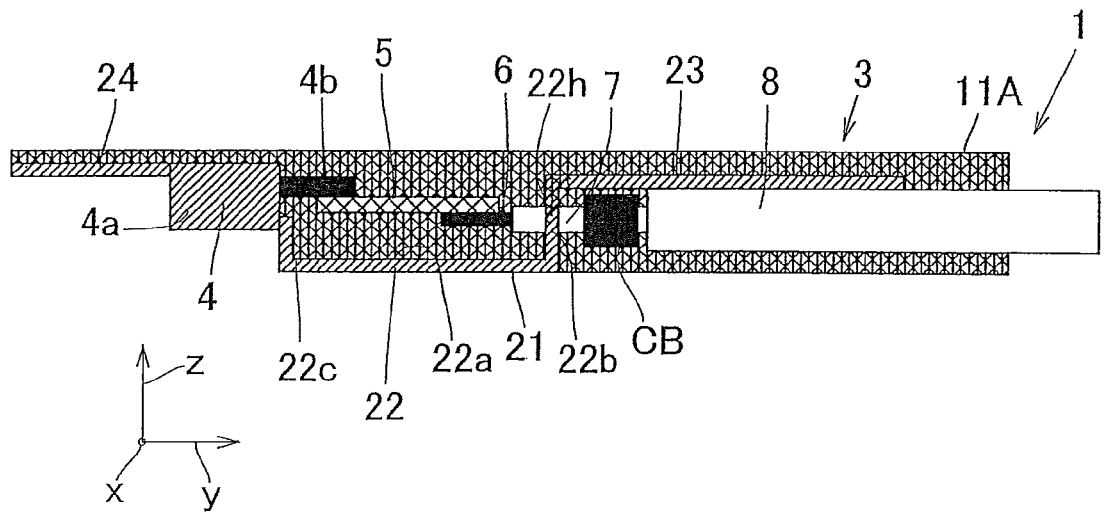
FIG. 13A is a longitudinal sectional view showing the rotation detecting device according to a sixth preferred embodiment of the present invention.
Figure 13B:
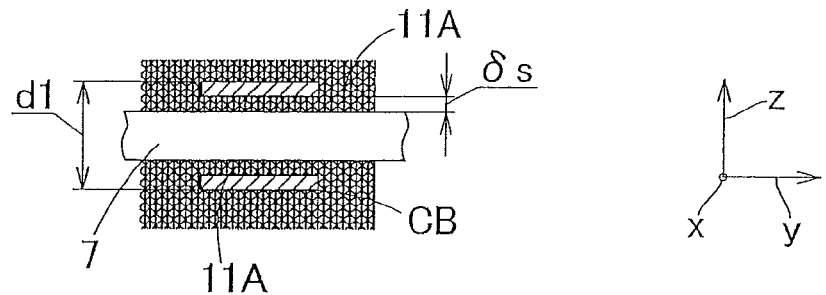
FIG. 13B is a fragmentary sectional view showing a cable sealing member or the like of the sixth preferred embodiment.
Figure 13C:
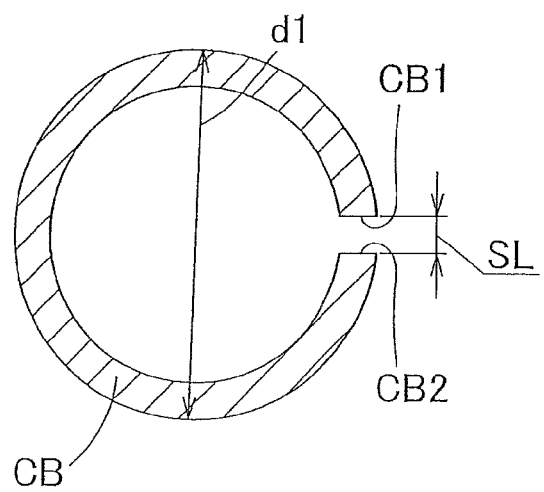
FIG. 13C is a sectional view showing the cable sealing member cut in an imaginary plane perpendicular to an axial direction thereof.

FIGS. 13A-13C are diagrams showing the rotation detecting device according to the sixth embodiment of the present invention, in which FIG. 13A is a sectional view of the rotation detecting device, FIG. 13B is a fragmentary sectional view showing the cable sealing member and others and FIG. 13C is a sectional view showing the cable sealing member cut in the imaginary plane perpendicular to the axial direction thereof. As best shown in FIG. 13B, the cable sealing member CB, in the form of a ring shaped member made of, for example, steel, aluminum, copper or brass, is sheathed around an outer periphery of the cable insulating sheath 7 with a gap 6s (annular gap 6s) defined between the cable sealing member CB and the cable insulating sheath 7. This cable sealing member CB is preferably made of a material capable of being plastically deformed. Also, the cable sealing member CB is desirably made of a metallic material having a good adhesion to, for example, the rubber material. The cable sealing member CB is interposed between a longitudinal end of the cable covering 8 and the first wall area 22b. As best shown in FIG. 13C, a portion of the cable sealing member CB in a circumferential direction is formed with a cutout or slit SL, and the cable sealing member CB is so structured as to be plastically deformed in a direction radially inwardly by the effect of a force applied externally. The electrode terminal 5, the cable core lines 6, the cable insulating sheathes 7 and the cable covering 8, other than the sensor 4, correspond respectively to the peripheral component parts. The cable insulating sheathes 7 and the cable covering 8 correspond to the outer skin of the cable.

When the pressure is uniformly applied from the outside (for example, in one z direction or in opposite z direction) to the rotation detecting device 1, circumferentially opposite side edges CB1 and CB2 of the cable sealing member CB, which form the cutout or slit SL as hereinbefore described, approach each other and, hence, the ring diameter d1 of the cable sealing member CB becomes smaller than that at the initial state prior to the application of the pressure. In other words, the cable sealing member CB is plastically deformed in the radially inward direction. By so doing, the cable sealing member CB generates a compressive force acting on the cable insulating sheath 7 and the elastic member 11A intervening radially inwardly of the cable sealing member CB. As a result thereof, formation of an undesirable gap between the cable insulating sheath 7 and the elastic member 11A is prevented, ensuring an assured water proofing property.

Since the cable sealing member CB is made of a metallic material, it exhibits a good adhesion to the rubber material and the cable sealing member CB itself serves to increase the strength of the rotation detecting device which is a molded body molded in the mold assembly. Since as a result of use of the cable sealing member CB having a good adhesion to the rubber material 11 the sealing between the cable sealing member CB and the rubber material 11 comes to be firm, the water proofing performance is excellent. When the cable sealing member CB is arranged within the rotation detecting device 1 so that the peripheral side edge CB1 (and the opposite peripheral side edge CB2) of the cable sealing member CB forming the cutout or slit SL is opposed to the direction in which the above described pressure is applied, the diameter reducing rate can be easily increased, at which the ring diameter d1 of the cable sealing member CB is reduced radially inwardly. Therefore, the compressive force can easily be generated between the elastic member 11A and the cable insulating sheath 7.

According to the rotation detecting device 1 to which the above described sixth embodiment of the present invention pertains, since the pressure is uniformly applied from the outside to the rotation detecting device 1, the ring diameter d1 of the cable sealing member CB comes to be smaller than that during the initial state prior to application of the pressure. Accordingly, the compressive force can be generated between the elastic member 11A and the cable insulating sheath 7 intervening radially inwardly of the cable sealing member CB. As a result thereof, formation of an undesirable gap between the cable insulating sheath 7 and the elastic member 11A is prevented, ensuring an assured water proofing property. Since the cable sealing member CB is made of a metallic material having a good adhesion to the rubber material, it serves to increase the strength of the rotation detecting device. Thus, since the cable sealing member CB has functions of increasing the strength and ensuring a water proofing property, the number of component parts can be reduced without complicating the structure of the device. Accordingly, the production cost of the device can also be reduced.

Although in this sixth embodiment the cutout or slit has been shown and described as formed in a circumferential portion of the cable sealing member, the present invention is not limited to this structure. By way of example, a plurality of cutouts may be formed in the circumference of the cable sealing member at intervals of a predetermined space (or at intervals of a constant space). According to this construction, the amount of plastic deformation of the cable sealing member in the radially inward direction can be increased to a value larger than that afforded in the sixth embodiment. Therefore, the sealing effect can be further increased.

The rotation detecting device according to a seventh preferred embodiment of the present invention will be subsequently described with particular reference to FIGS. 14A to 17. This embodiment differs from the second embodiment shown and described in FIG. 5 in that this embodiment makes use of a ring member RB, and other structural features than that described above are similar to those employed in the previously described second embodiment of the present invention.

Figure 14A:
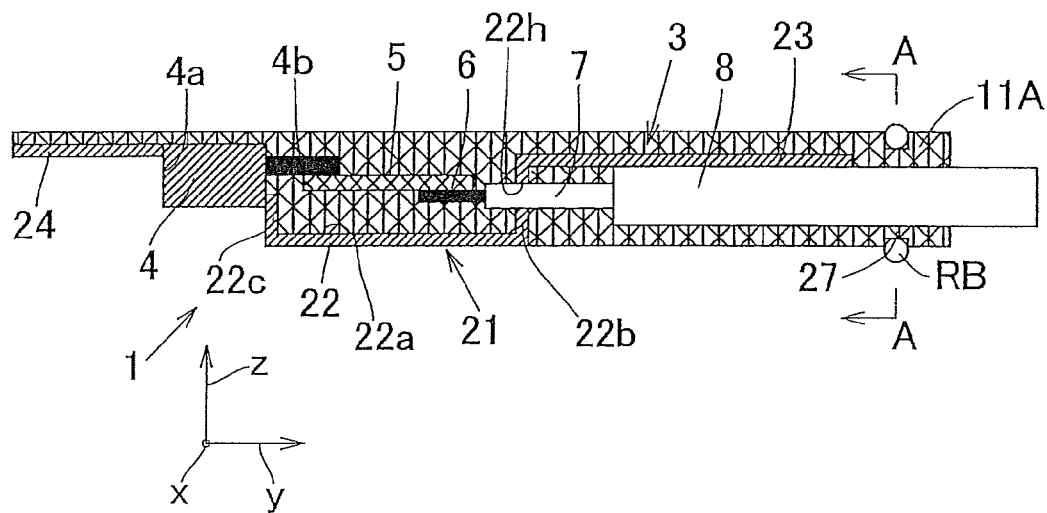
FIG. 14A is a longitudinal sectional view showing the rotation detecting device according to a seventh preferred embodiment of the present invention.
Figure 14B:
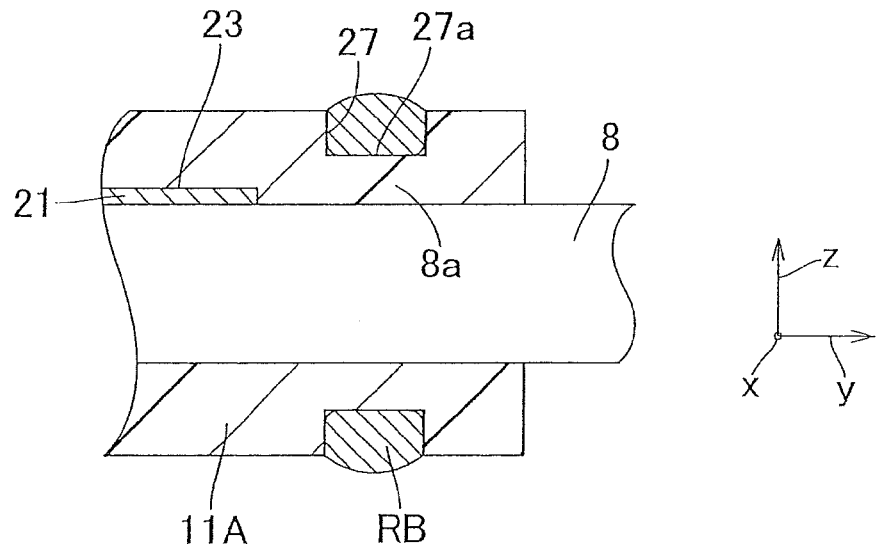
FIG. 14B is a fragmentary longitudinal sectional view showing a ring member or the like of the seventh preferred embodiment.
Figure 14C:
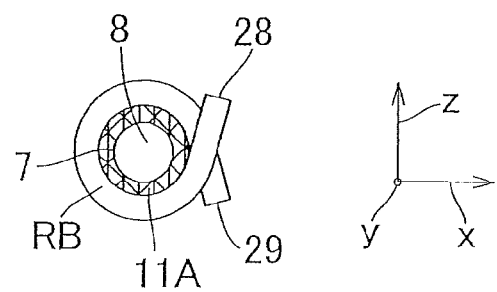
FIG. 14C is a cross sectional view taken along the line A-A in FIG. 14A.

FIGS. 14A-14C illustrate the rotation detecting device according to the seventh embodiment of the present invention, in which FIG. 14A is a sectional view of the rotation detecting device, FIG. 14B is a fragmentary sectional view showing the ring member RB and others and FIG. 14C is a cross sectional view taken along the line A-A in FIG. 14A. Referring first to FIG. 14A, a y-directional end portion of an outer peripheral surface portion of the elastic member 11A serving as a covering material is formed with an annular groove 27, into which the ring member RB is engaged. As shown in FIG. 14B, the ring member RB has a function of applying a compressive force to an annular groove bottom surface 27a positioned radially inwardly thereof and a portion 8a of the cable covering 8. In other words, in this seventh embodiment of the present invention, the ring member RB is a member capable of undergoing an elastic deformation in the radial direction and is detachably engaged in the annular groove 27 in the elastic member 11A. With the ring member RB engaged in the annular groove 27, the annular groove bottom surface 27a of the elastic member 11A and the cable covering 8 positioned radially inwardly thereof are held in a tightly fastened state.

As best shown in FIG. 14C, the ring member RB is formed by winding, for example, a single metallic wire annularly with opposite ends 28 and 29 of the wire protruding a predetermined small distance in a direction radially outwardly of the circle defined by the ring and spaced in respective directions away from each other. The ring member RB may be occasionally made of a non-metallic material. The ring member RB is so designed and so structured that when with the ring member RB engaged in the annular groove 27, a force is applied by, for example, fingers or any other tool not shown, to the opposite ends 28 and 29 of the wire so as to bring those opposite ends 28 and 29 close towards each other, the ring member RB can be diametrically expanded against the elastic force of the ring member RB enough to detach from the annular groove 27. On the other hand, the ring member RB is also so designed and so structured that, where the ring member RB is detached from the annular groove 27 and the force is applied to the opposite ends 28 and 29 of the wire to bring them close towards each other, the ring member RB can be diametrically expanded against the biasing force of the ring member RB to allow the ring member RB to be mounted in the annular groove 27.

Since the ring member RB is seated within the annular groove 27 defined in the elastic member 11A, it is possible to avoid an undesirable displacement of the ring member RB in the y-direction while the sensor is fitted. Also, since the ring member RB is engaged in the annular groove 27, it is possible not only to avoid the displacement of the ring member RB in the y-direction, but also to apply a required and sufficient compressive force to the elastic member 11A and the cable covering 8. Accordingly, it is possible to prevent the built-in component parts from being damaged due to a force excessively acting thereon.

Figure 15:
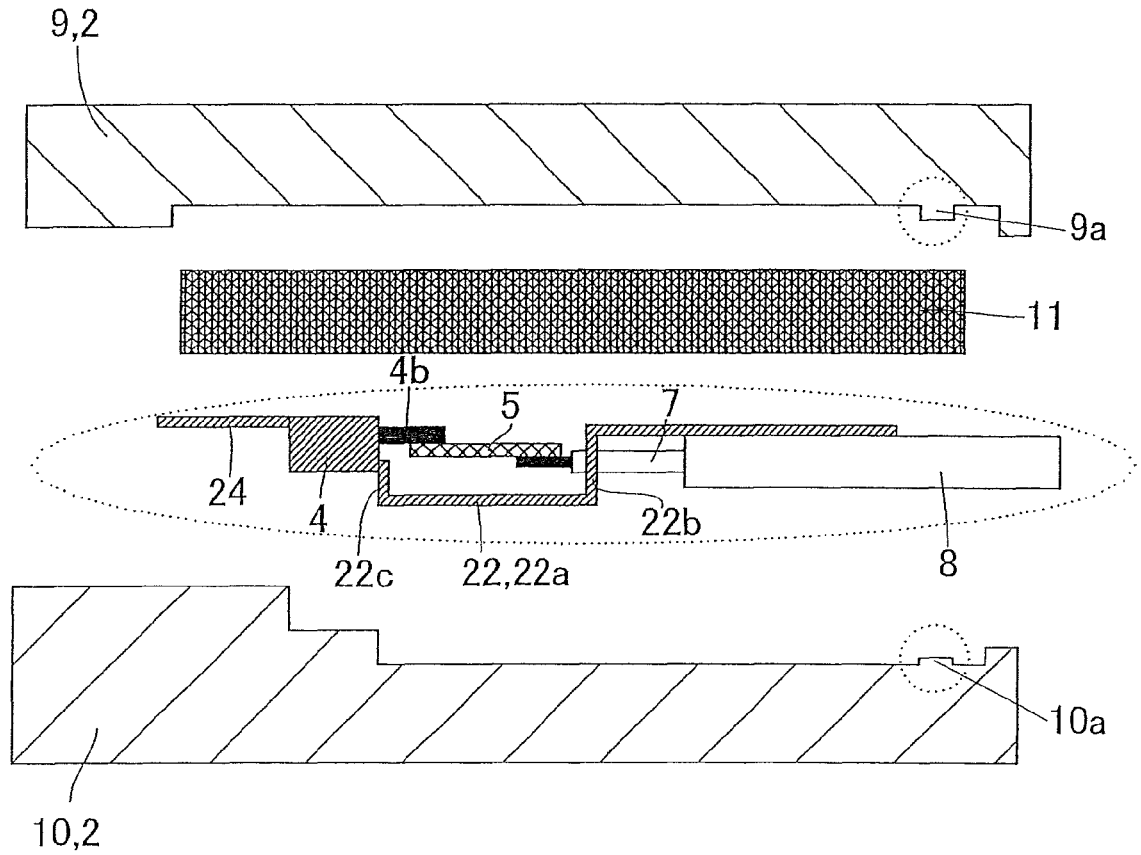
FIG. 15 is a longitudinal sectional view, showing the stage taking place before the compressive molding with the use of the mold assembly including the upper mold, the lower mold and the rubber material for formation of the sensor assembly in accordance with the seventh embodiment of the present invention.
Figure 16:
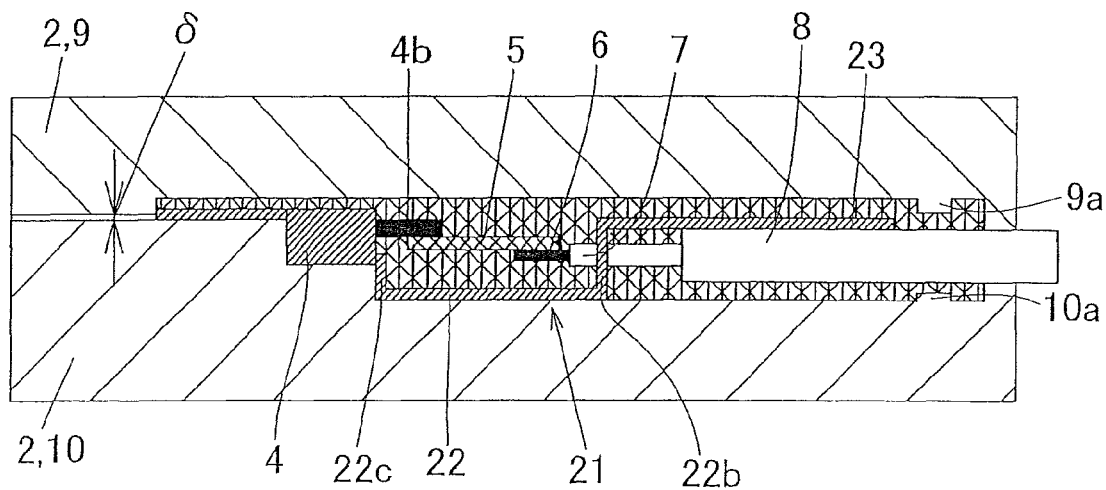
FIG. 16 is a longitudinal sectional view, showing the condition in which the sensor assembly and the rubber material are intervened and sandwiched between the upper mold and the lower mold in the practice of the seventh embodiment of the present invention.

FIG. 15 is a sectional view showing the condition before the compressive molding with the use of the mold assembly including the upper mold, the lower mold, the rubber material and the sensor assembly is carried out. FIG. 16 is a sectional view showing the condition in which the sensor assembly and the rubber material are interposed between the upper mold and the lower mold. The sensor assembly 3 best shown in FIG. 14 is molded by sandwiching it together with the rubber material 11, mixed with a vulcanizing agent, in the mold assembly 2 including the upper mold 9 and the lower mold 10. The upper mold 9 and the lower mold 10 are provided with an upper projection 9a and a lower projection 10a, respectively, for forming the annular groove 27. As shown in FIG. 15, the assembly 3 is sandwiched between the upper mold 9 and the lower mold 10 together with the rubber material 11 mixed with the vulcanizing agent. As best shown in FIG. 16, while the sensor assembly 3 and others are completely sandwiched by and between the upper mold 9 and the lower mold 10, the upper mold 9 and the lower mold 10 are heated for a predetermined time and then, a pressure is applied to the sensor assembly 3 and others to complete the compressive molding. Since as hereinbefore described the upper mold 9 and the lower mold 10 are provided with the upper projection 9a and the lower projection 10a, respectively, the circumferentially extending annular groove 27 can be left at such site (the radially outwardly site of the cable covering 8) in the elastic member 11A after the compressive molding.

Figure 17:
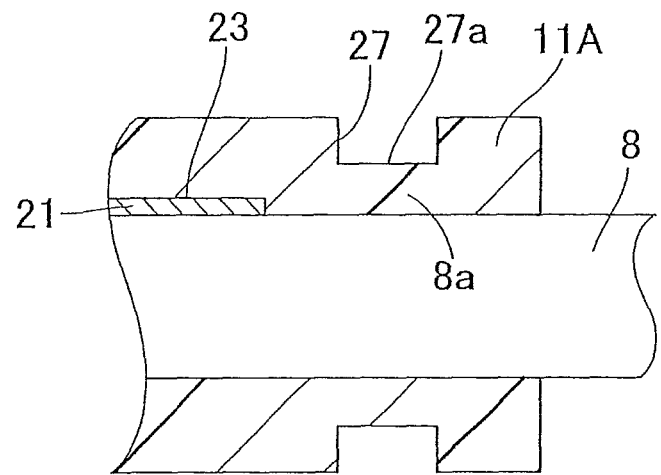
FIG. 17 is a longitudinal sectional view, showing the entire structure before a ring member being pressed, after the compressive molding with the use of the mold assembly in the practice of the seventh embodiment of the present invention.

FIG. 17 is a fragmentary sectional view of the rotation detecting device after the molding of the elastic member, but before the ring member is mounted thereon. The following description will proceed also with reference to FIG. 14. In a condition in which the ring member RB is removed from the annular groove 27, a force is applied to the opposite ends 28 and 29 of the wire forming the ring member RB so as to bring them in a direction close towards each other. By so doing, the ring member RB is diametrically expanded against the biasing force exerted by the ring member RB and is then mounted into the annular groove 27.

According to the rotation detecting device 1 and the method of making it according to the above described seventh embodiment of the present invention, when after the elastic member 11A and others have been integrally molded, the elastic member 11A and the cable covering 8 are held in the fastened condition by means of the ring member RB, and therefore, the elastic member 11A can be deformed to increase the adhesion between the elastic member 11A and the cable covering 8 to thereby increase the water proofing performance between the cable covering 8 and the elastic member 11A. Accordingly, it is possible to assuredly prevent water or the like from entering in between the cable covering 8 and the elastic member 11A to thereby maintain the sensor component parts in a water proofing condition. For this reason, the versatility of the rotation detecting device 1 can be enhanced. Also, the ring member RB can be mounted in the annular groove 27 simply by diametrically expanding it and, therefore, the workability can be simplified and the number of manufacturing steps can be reduced. In view of this, the production cost can be reduced.

The ring member may be of a type in which a slit or cutout is formed at one location on the circumference thereof. Although in the seventh embodiment the elasticity of the ring member is utilized, any suitable means effective to increase the adhesion between the cable covering 8 and the elastic member 11A may be employed. By way of example, a string-like element, a screw locking member or the like can be employed. The ring member may be provided not only in a portion of the elastic member 11A in the y direction, but also in a plurality of portions of the elastic member 11A in the y direction. In such case, the water proofing performance between the cable covering 8 and the elastic member 11A can be further increased.

FIGS. 18 to 26 illustrate sectional views showing, respectively, eighth to sixteenth preferred embodiments of the present invention, all of which are related with the wheel support bearing assembly equipped with the rotation detecting device 1 according to any one of the foregoing embodiments of the present invention. In the first place, the structure common to those embodiment will be described, followed by the description concerning individual differences of those examples. It is to be noted that hereinafter in this specification, terms "outboard" and "inboard" represent one side of the vehicle body away from the longitudinal center of the vehicle body and the other side of the vehicle body close to the longitudinal center of the vehicle body, respectively, when assembled in the vehicle body.

Any of those wheel support bearing assemblies according to the eighth to sixteenth preferred embodiments of the present invention includes an outer member 51, an inner member 52 and a plurality of rolling elements 53 interposed between the outer member 51 and the inner member 52 for rotatably supporting a vehicle wheel relative to a vehicle body structure, and also includes the rotation detecting device 1 according to any one of the foregoing embodiments and a magnetic encoder 71, which is an object to be detected by this rotation detecting device 1, both mounted thereon. Although any one of the rotation detecting devices 1 according to the first to seventh embodiments of the present invention shown in and described with reference to FIGS. 1 to 17 can be employed, the appearance of the rotation detecting device 1 may not be of such a shape as shown in FIGS. 1 to 17, but may be of such a shape appropriate to the mode of mounting for each of the eighth to sixteenth embodiments.

The outer member 51 is a stationary member whereas the inner member 52 is a rotational member. The rolling elements 53 for each row are retained by a respective retainer 54 employed for each row and are interposed between a plurality of rolling surfaces 55, defined in an inner periphery of the outer member 51, and a plurality of rolling surfaces 56 defined in an outer periphery of the inner member 52. Any of those wheel support bearing assemblies are rendered to be a double row angular contact ball bearing type, with the rolling surfaces 55, 55 and 56, 56 so formed as to represent respective rolling element contact angles that are held in back-to-back relation with each other. Hereinafter, each of those wheel support bearing assemblies shown in FIGS. 18 to 26 will be described in detail.

Figure 18:
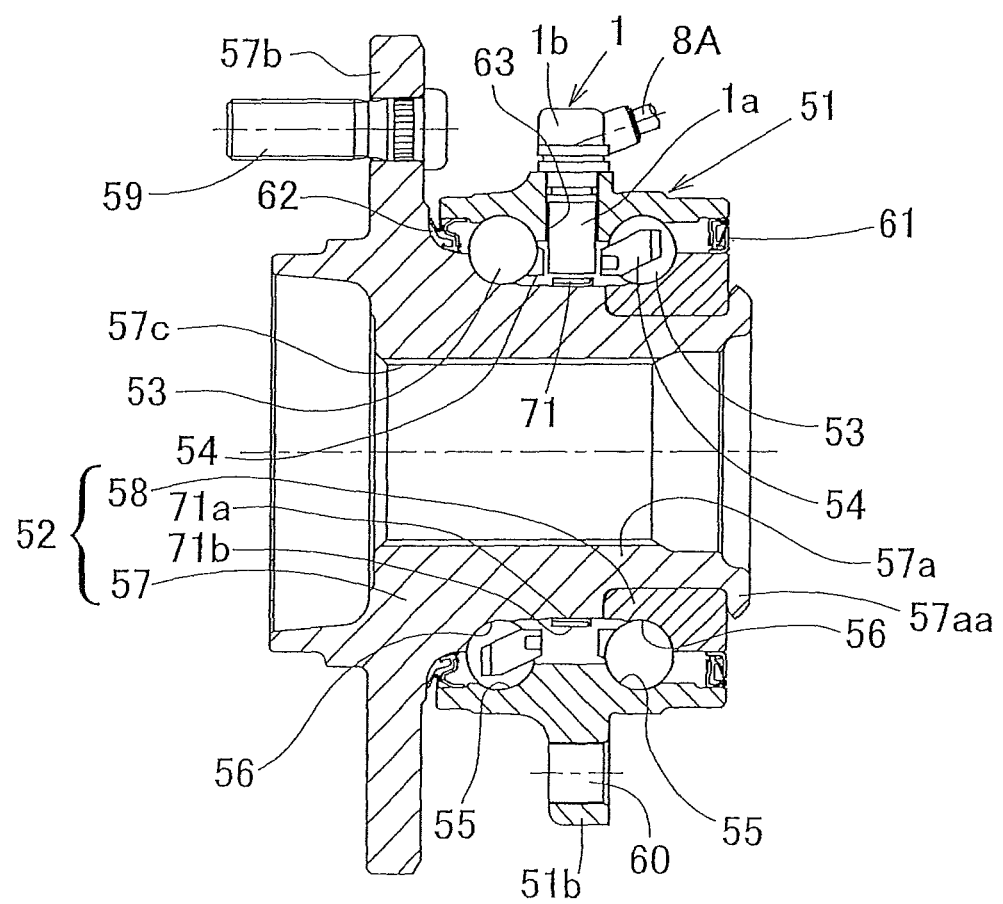
FIG. 18 is a longitudinal sectional view showing a wheel support bearing assembly according to an eighth preferred embodiment of the present invention.

The eighth embodiment shown in FIG. 18 is an example, which is applied to a so-called third generation type for the support of a vehicle drive wheel. The inner member 52 is made up of two members including a hub unit 57 and an inner ring 58 mounted on an outer periphery of an inboard side of an axle portion 57a of the hub unit 57, and the rolling surfaces 56 of the respective row discussed above are formed respectively in the outer peripheries of the axle portion 57a of the hub unit 57 and of the inner ring 58. The axle portion 57a of the hub unit 57 has a center bore 57c defined therein for the passage therethrough of a stem portion of a constant velocity universal joint (not shown). The inner ring 58 is mounted within a stepped area formed in the axle portion 57a of the hub unit 57 and is fixed to the hub unit 57 by means of a crimped portion 57aa provided at an inboard end of the axle portion 57a. The hub unit 57 has a wheel mounting flange 57b formed on the outer periphery thereof in the vicinity of an outboard end thereof, and a wheel and a brake rotor (both not shown) are fitted to the wheel mounting flange 57b in overlapping relation to each other by means of hub bolts 59. The hub bolts 59 are press-fitted into respective bolt mounting holes provided in the wheel mounting flange 57b. The outer member 51 is of one-piece construction including a vehicle body fitting flange 51b formed on the outer periphery thereof. The outer member 51 is fitted to a knuckle (not shown) of a suspension system by means of knuckle bolts passed through respective bolt holes 60 defied in the vehicle body fitting flange 51b.

Opposite ends of a bearing space delimited between the outer member 51 and the inner member 52 are sealed by respective sealing devices 61 and 62 each including, for example, a contact seal.

A magnetic encoder 71 is in the form of a ring shaped multipolar magnet having magnetic poles N and S alternating in a direction circumferentially thereof and is mounted on an outer peripheral surface of the inner member 52 while being positioned intermediate between the rows of the rolling elements 53 and 53. The magnetic encoder 71, which is a to-be-detected element, is in the form of, for example, a multipolar magnet 71b such as, for example, a rubber magnet or plastic magnet, mounted on an outer periphery of a core member 71a or in the form of a sintered magnet.

The rotation detecting device 1 is inserted into and fitted within a sensor mounting hole 63 defined in the outer member 51 so as to extend radially thereof at a location between the rows of the rolling elements 53 and 53, with its tip (a portion where the sensor 4 shown in FIG. 4 is embedded) oriented radially towards the magnetic encoder 71, which is the to-be-detected element, with a radial magnetic gap intervening between it and the magnetic encoder 71. The sensor mounting hole 63 is in the form of a throughhole of, for example, a round section. An annular gap between an inner surface of the sensor mounting hole 63 and the rotation detecting device 1 may be sealed by means of a contact seal such as, for example, an O-ring or a bonding material.

The rotation detecting device 1 has a columnar insert 1a of an inner diameter sufficient to fit substantially inside the sensor mounting hole 63 and a head 1b, which is a non-insert. The head 1b is arranged in contact with the outer peripheral surface of the outer member 51. A cable 8A is drawn outwardly from the head 1b. The insert 1a and the head 1b are contoured by the elastic member 11a shown in FIG. 1. The head 1b may be covered with a metal or a resin to protect the rotation detecting device 1.

Figure 27:
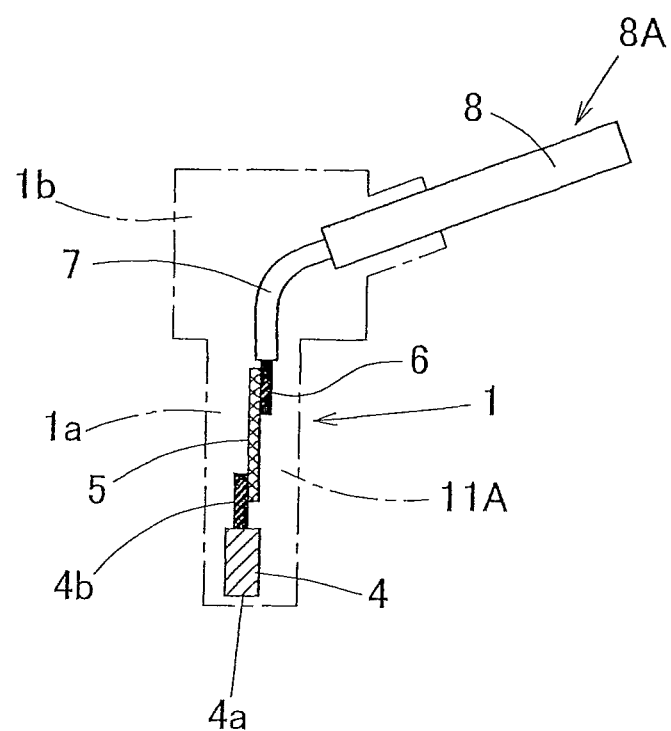
FIG. 27 is a longitudinal sectional view showing an example of use of the rotation detecting device according to the first embodiment of the present invention.

The cable 8A includes the cable core lines 6, the cable insulating sheathes 7 and the cable covering 8 shown in FIG. 1. Although in the example shown in FIG. 1, the cable is show as extending straight, where it is mounted on the wheel support bearing assembly according to the embodiment shown in FIG. 18, the rotation detecting device 1 is such that the cable 8A is bent as illustrated, for example, in the example of use in FIG. 27. In this figure, the portion constituted by the elastic member 11A shown in FIG. 1 is shown in a schematic sectional view by the phantom line.

According to the wheel support bearing assembly of the structure described hereinabove, even where it is used under the severe environment, in which a temperature change from some tens degree to minus some tens degree occurs, the elastic member 11A of the rotation detecting device undergoes an elastic deformation following such temperature change. Also, even when vibrations are applied to the wheel support bearing assembly incident to travel of the automotive vehicle, the elastic member 11A of the rotation detecting device 1 undergoes an elastic deformation following the vibrations. Accordingly, it is possible to avoid an undesirable ingress of water or the like into the interior of the wheel support bearing assembly through between the rotation detecting device 1 and the inner surface of the sensor mounting hole 63 in the outer member 51. Also, even under such severe environment, in the event that different thermal expansions occur in the sensor assembly 3 and the elastic member 11A, which is a covering material, in the rotation detecting device 1, the difference between those different thermal expansions can be absorbed by the elasticity of the elastic member 11A. Accordingly, it is possible to avoid formation of an undesirable gap between the sensor assembly 3 and the elastic member 11A and also to secure the water proofing property of the sensor assembly 3. For this reason, it can be realized to provide the wheel support bearing assembly having such performances as, for example, a mechanical strength, a water proofing property, a weather resistance and a chemical resistance, all of which are required for automobile component parts to satisfy.

Figure 19:
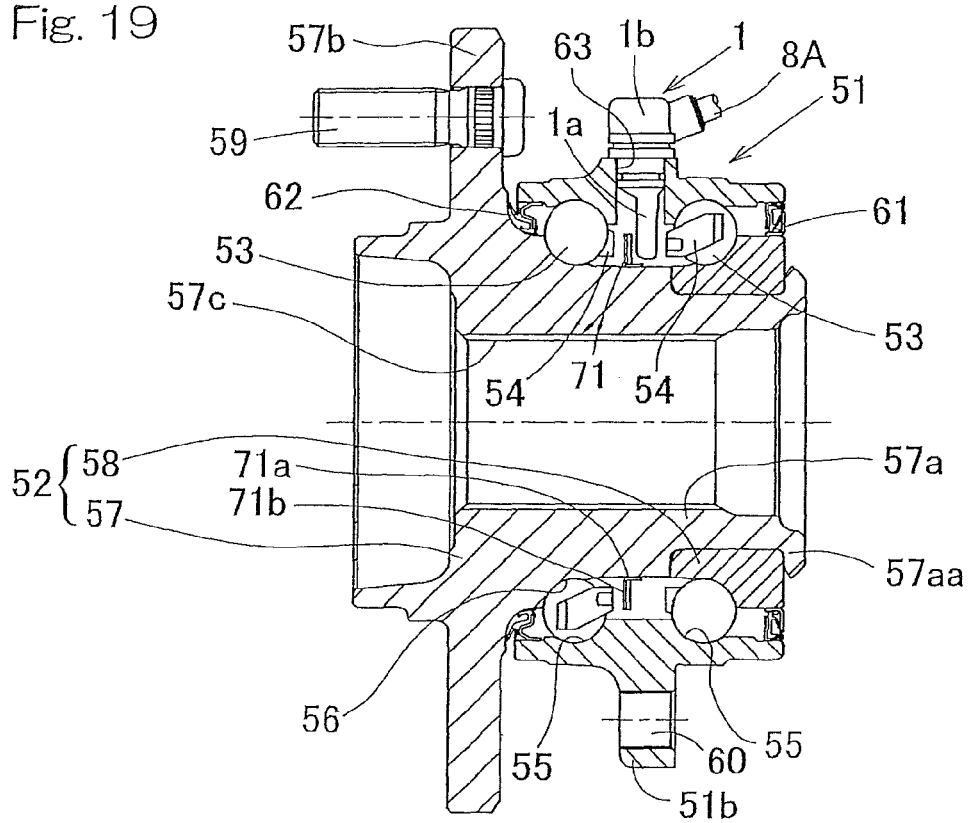
FIG. 19 is a longitudinal sectional view showing the wheel support bearing assembly according to a ninth preferred embodiment of the present invention.

The ninth embodiment shown in FIG. 19 is such that in the wheel support bearing assembly shown in and described with reference to FIG. 18, the direction in which the rotation detecting device 1 and the magnetic encoder 71 are oriented relative to each other is chosen to be an axial direction. The magnetic encoder 71 is of a type including an L-sectioned core member 71a having an upright portion on which the multipolar magnet 71b is provided. The rotation detecting device 1 includes the sensor 4 positioned inside the tip thereof and oriented in the axial direction relative to the multipolar magnet 71b of the magnetic encoder 71. Other structural features than those described above and effects brought about by this embodiment are similar to those discussed in connection with the embodiment shown in and described with reference to FIG. 18.

Figure 20:
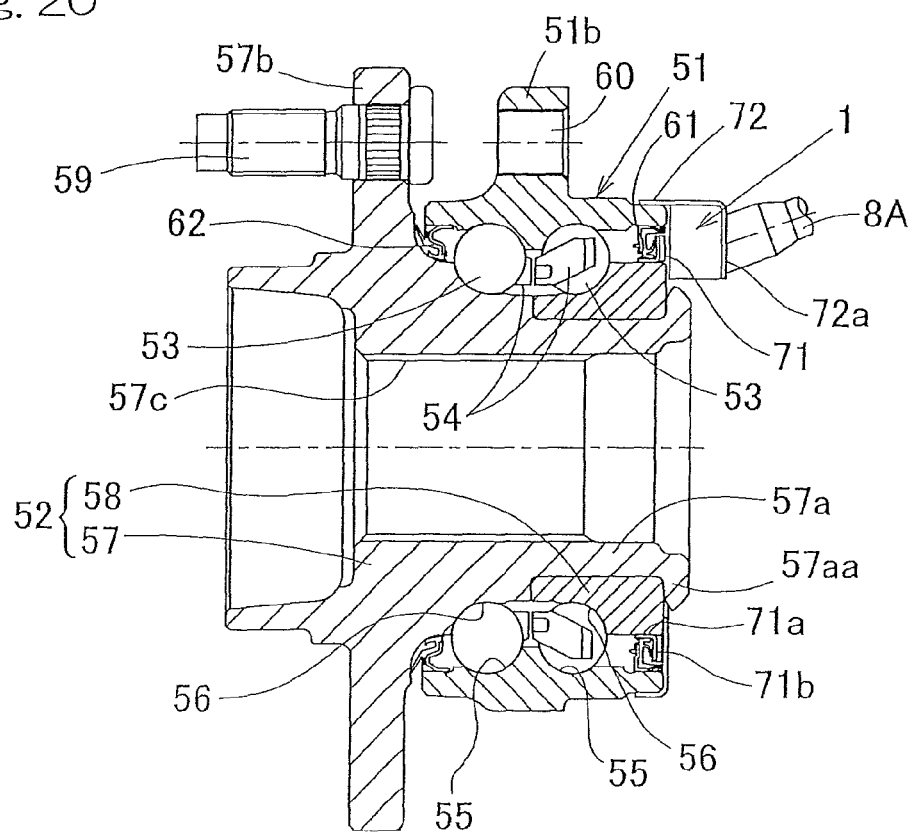
FIG. 20 is a longitudinal sectional view showing the wheel support bearing assembly according to a tenth preferred embodiment of the present invention.

The tenth embodiment shown in FIG. 20 is such that in the wheel support bearing assembly shown and described with particular reference to FIG. 18, the rotation detecting device 1 is fitted to the inboard end of the outer member 51 through a sensor carrier member 72. The sensor carrier member 72 is a ring shaped metallic plate mounted on the outer peripheral surface of the outer member 51 and held in contact with an inboard end face of the outer member 51. The sensor carrier member 72 has a sensor carrier piece 72a provided in a portion of the circumference thereof, to which the rotation detecting device 1 is fitted. The magnetic encoder 71 is of a type provided with a multipolar magnet 71b mounted on an upright portion of the L-sectioned core member 71a and is mounted on the outer periphery of the inner ring 58. The magnetic encoder 71 is rendered to concurrently serve as a portion of the inboard sealing device 61. The magnetic encoder 71 and the rotation detecting device 1 are opposed to each other in the axial direction.

In the case of this construction, since the sensor mounting hole 63 employed in the practice of the embodiment shown in FIG. 18 need not to be provided in the outer member 1, there is no problem associated with an ingress of water from the sensor mounting hole 63. Other structural features than those described above and effects brought about by this embodiment are similar to those discussed in connection with the embodiment shown in and described with reference to FIG. 18.

Figure 21:
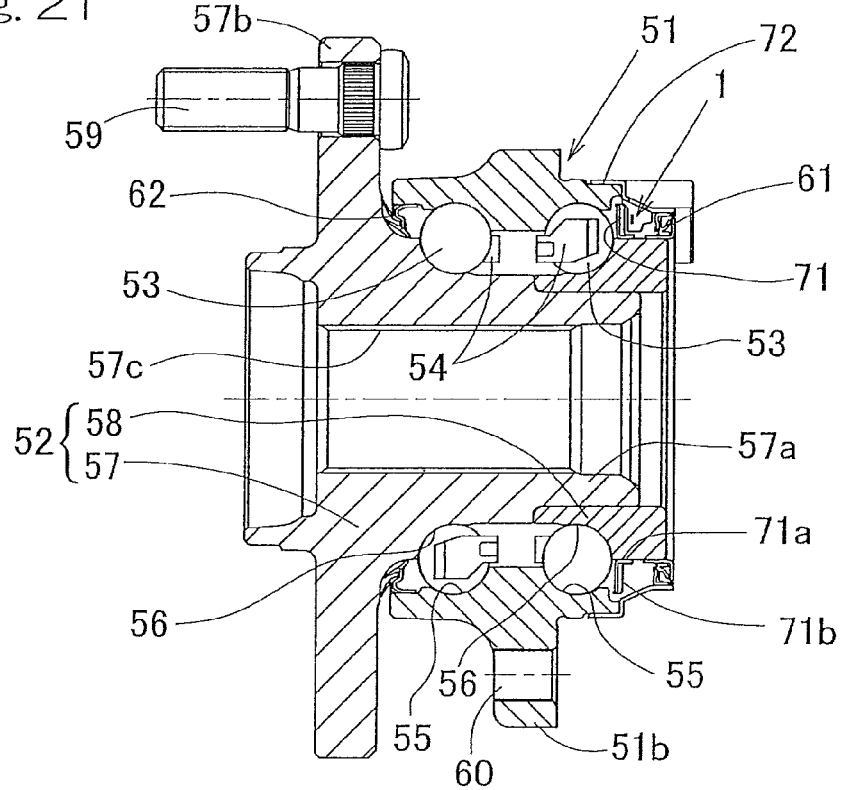
FIG. 21 is a longitudinal sectional view showing the wheel support bearing assembly according to an eleventh preferred embodiment of the present invention.

The eleventh embodiment shown in FIG. 21 is such that in the embodiment shown in and described with particular reference to FIG. 20 the inboard sealing device 61 for the bearing space is positioned outside of the magnetic encoder 71. In other words, the sealing device 61 in the form of a contact seal or the like is provided between the inner ring 58 and the annular sensor carrier member 72 fitted to the outer member 51.

In the case of this construction, the magnetic encoder 71 is sealed from an external space by the sealing device 61 and any possible bite of foreign matter in between the magnetic encoder 71 and the rotation detecting device 1 can be avoided. Other structural features than those described above and effects brought about by this embodiment are similar to those discussed in connection with the embodiment shown in and described with reference to FIG. 20.

Figure 22:
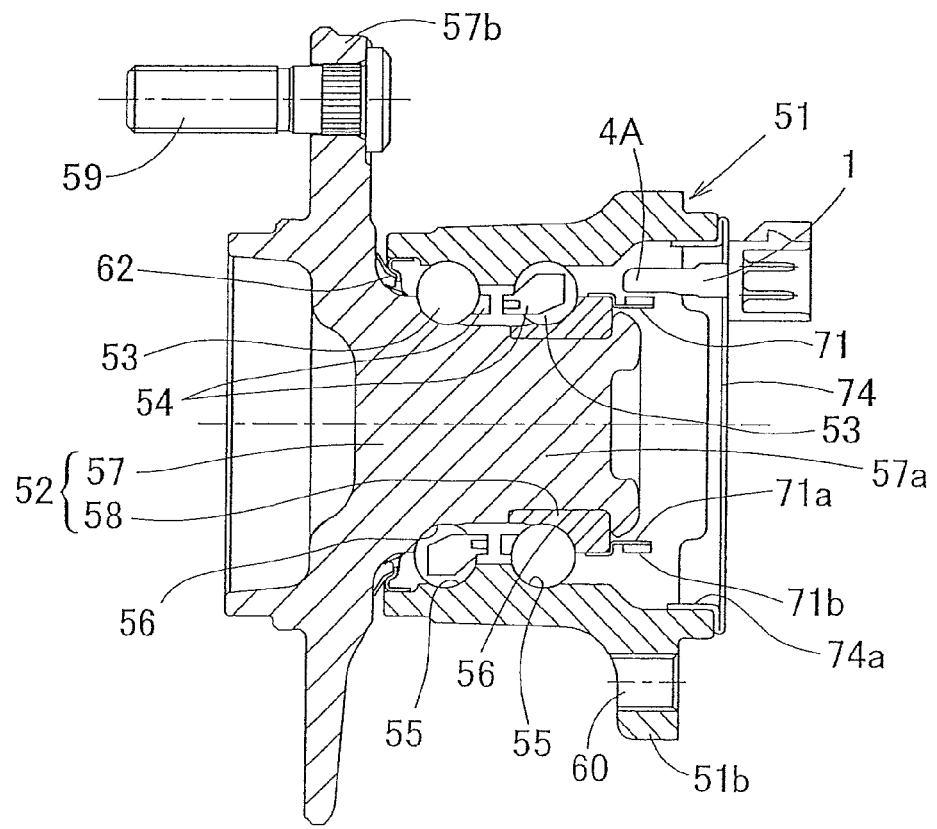
FIG. 22 is a longitudinal sectional view showing the wheel support bearing assembly according to a twelfth preferred embodiment of the present invention.

The twelfth embodiment shown in FIG. 22 is such that in the embodiment shown in and described with particular reference to FIG. 18, it is designed to support a vehicle driven wheel and, therefore, the hub unit 57 has no center hole and is solid. The inboard end of the outer member 51 extends axially beyond the inner member 52 with its end face opening covered by a cover 74. The cover 74 is fitted to the outer member 51 with a collar 74a provided in an outer peripheral edge thereof mounted on the inner periphery of the outer member 51. The rotation detecting device 1 is fitted to this cover 74 so as to confront the magnetic encoder 71 in the radial direction. While at least the sensor portion 4A (the portion where the sensor 4 is embedded) of the rotation detecting device 1 is inserted into the cover 74, the body of the rotation detecting device 1 is detachably provided by means of bolts and nuts both not shown. With the sensor portion 4A inserted into the cover 74 through an insertion hole provided therein, the annular gap of the cover 74 formed between the through hole and the body of the rotation detecting device 1 is tightly sealed by the elasticity of the covering material (the elastic member) then covering the sensor portion 4A. The magnetic encoder 71 is mounted on the outer periphery of the inner ring 58 so as to confront the rotation detecting device 1 in the radial direction.

In the case of this construction, although application is limited to the support of the vehicle driven wheel, the end opening of the outer member 51 in its entirety can be covered by the cover 74 and, therefore, a high sealing performance can be obtained with a simple construction. Other structural features than those described above and effects brought about by this embodiment are similar to those discussed in connection with the embodiment shown in and described with reference to FIG. 18.

Figure 23:
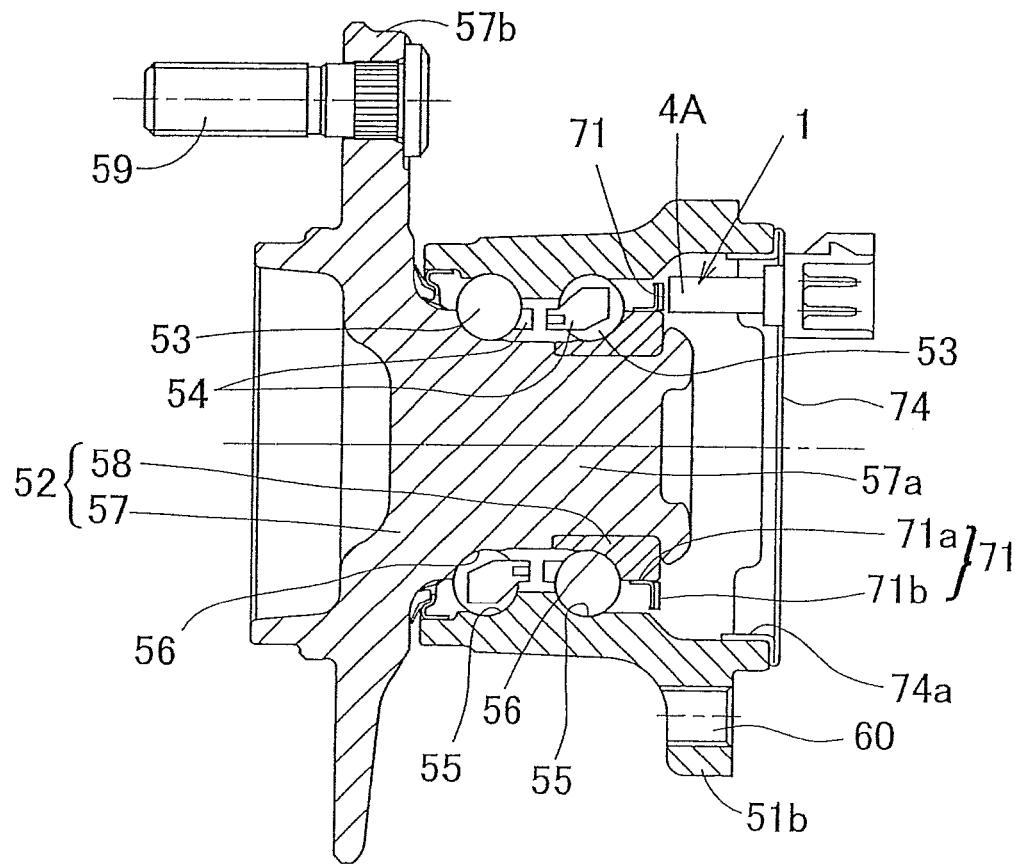
FIG. 23 is a longitudinal sectional view showing the wheel support bearing assembly according to a thirteenth preferred embodiment of the present invention.

The thirteenth embodiment shown in FIG. 23 is such that in the embodiment shown in and described with particular reference to FIG. 22, the magnetic encoder 71 includes an L-sectioned annular core member 71a mounted on the outer peripheral surface of the inner ring 58 with the multipolar magnet 71b fitted to the upright portion of the annular core member 71a, and this magnetic encoder 71 and the rotation detecting device 1 are opposed to each other in the axial direction. Other structural features than those described above and effects brought about by this embodiment are similar to those discussed in connection with the embodiment shown in and described with reference to FIG. 22.

Figure 24:
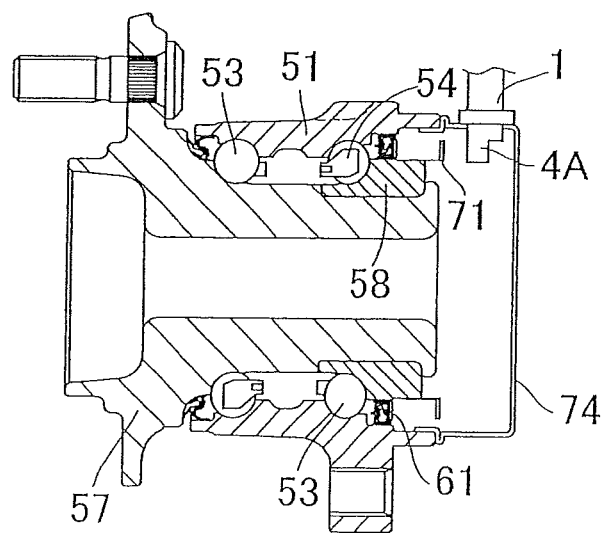
FIG. 24 is a longitudinal sectional view showing the wheel support bearing assembly according to a fourteenth preferred embodiment of the present invention.

The fourteenth embodiment shown in FIG. 24 is such that in the embodiment shown in and described with reference to FIG. 23, the cover 74 is formed in a cup-like shape and the rotation detecting device 1 is fitted to a cylindrical peripheral wall thereof so as to extend radially therethrough. Other structural features than those described above and effects brought about by this embodiment are similar to those discussed in connection with the embodiment shown in and described with reference to FIG. 23.

Figure 25:
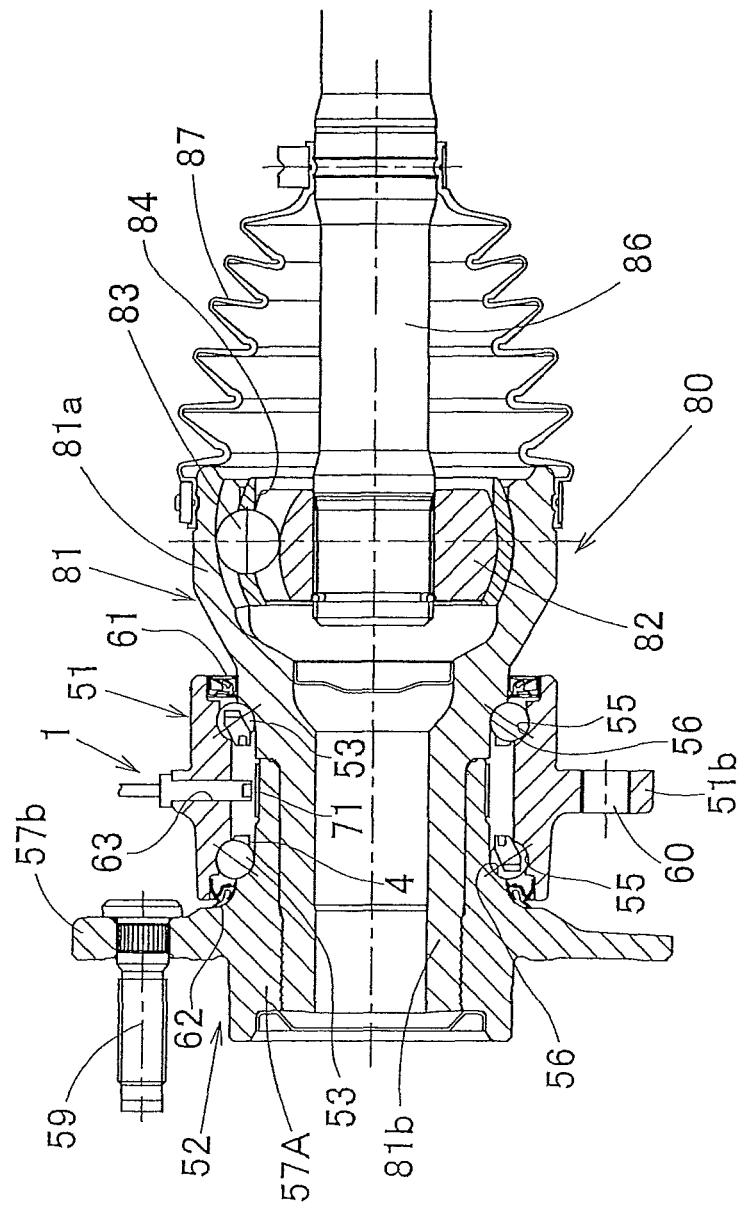
FIG. 25 is a longitudinal sectional view showing the wheel support bearing assembly according to a fifteenth preferred embodiment of the present invention.

The wheel support bearing assembly according to the fifteenth embodiment shown in FIG. 25 is an example of a so-called fourth generation type, in which the inner member 52 is made up of a hub axle 57A and an outer ring 81 of a constant velocity universal joint 80.

The constant velocity universal joint 80 is of a design, in which a plurality of axially extending track grooves are formed in a spherical inner surface of the outer ring 81 thereof and a spherical outer surface of an inner ring 82 thereof and torque transmitting balls 83 are interposed between the opposed track grooves. The torque transmitting balls 83 are retained in a retainer 84. The inner ring 82 is mounted on a shaft 86. The constant velocity universal joint outer ring 81 has a cylindrical hollow stem portion 81b protruding from a bottom face of a cup portion 81a. This stem portion 81b is inserted into the hub axle 57A of the wheel support bearing assembly and is integrally coupled with the hub axle 57A by means of a diametric expansion and crimping technique. The rolling surfaces of the inner member 52 for the rows are formed in the hub axle 57A and the constant velocity universal joint outer ring 81, respectively. A bellows shaped boot 87 is mounted so as to cover between the opening of the cup portion 81a of the constant velocity universal joint outer ring 81 and the outer periphery of the shaft 86.

The rotation detecting device 1 is fitted to the outer member 51, having been inserted into the sensor mounting hole 63 defined in the outer member 51 so as to extend therethrough, in a manner similar to that shown and described in connection with the embodiment of FIG. 18. The magnetic encoder 71 is fitted to the inner member 52, having been mounted on the outer periphery of the hub axle 57A in the inner member 52, in a manner similar to that shown and described in connection with the embodiment of FIG. 18. The magnetic encoder 71 and the rotation detecting device 1 are opposed to each other in the radial direction.

Even in this example, effects similar to those afforded by the rotation detecting device 1 according to the embodiment shown in and described with reference to FIG. 18 can be obtained.

Figure 26:
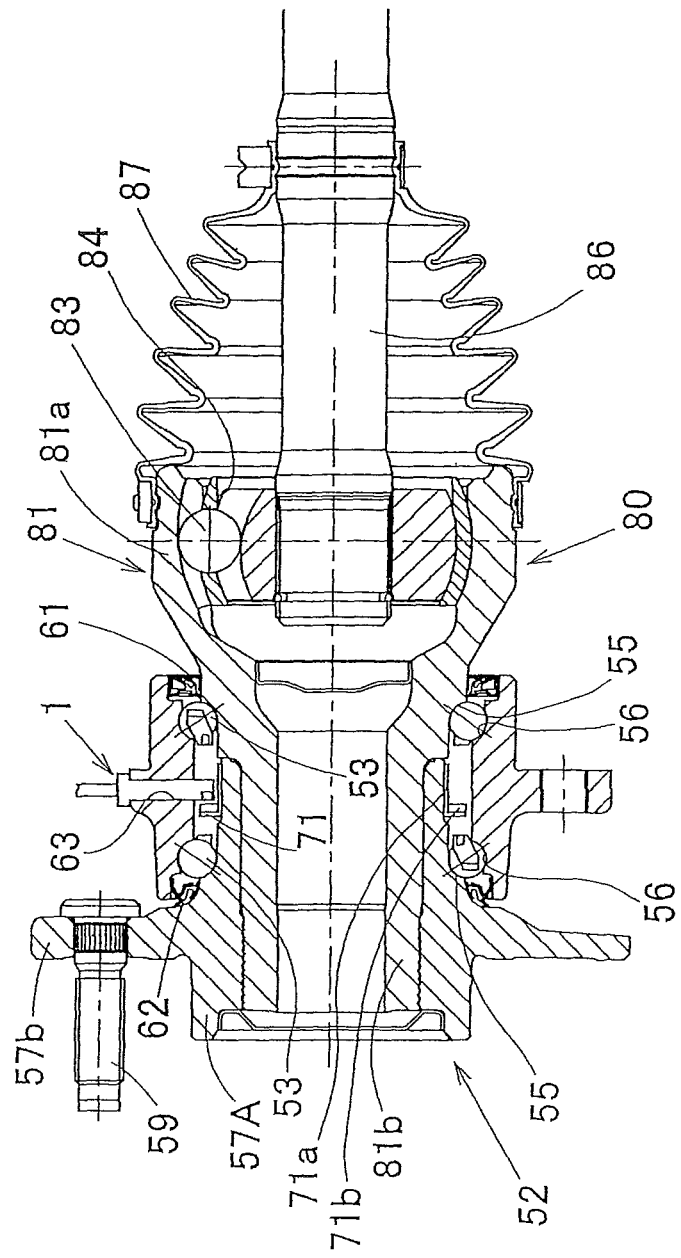
FIG. 26 is a longitudinal sectional view showing the wheel support bearing assembly according to a sixteenth preferred embodiment of the present invention.

The sixteenth embodiment shown in FIG. 26 is such that in the embodiment shown in and described with reference to FIG. 25, the magnetic encoder 71 includes the L-sectioned annular core member 71a mounted on the outer peripheral surface of the inner ring 52 with the multipolar magnet 71b fitted to the upright portion of the annular core member 71a, and the magnetic encoder 71 is oriented so as to confront the rotation detecting device 1 in the axial direction. Other structural features than those described above and effects brought about by this embodiment are similar to those discussed in connection with the embodiment shown in and described with reference to FIG. 25.

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention.

By way of example, although the wheel support bearing assembly according to any one of the foregoing embodiments of the present invention has been shown as examples of a third or fourth generation type, the present invention can be equally applied to a wheel support bearing assembly of a first or second generation type, in which the hub unit and the bearing unit are provided separately, and also to a wheel support bearing assembly in which the outer member serves as a rotational member and the inner member serves as a stationary member. Also, the present invention can be equally applied not only to the angular contact ball bearing type, but also a wheel support bearing assembly of a tapered roller type or any other type.

In addition, although the rotation detecting device 1 has been shown and described as fitted to the wheel support bearing assembly, it is possible to secure at least one of the fixing attachment 21 of the rotation detecting device 1 and the first and second press-fixing members PL1 and PL2 to the peripheral member of the wheel support bearing assembly. Yet, the to-be-detected element detected by the rotation detecting device 1 is not always limited to the magnetic encoder, but may be a gear shaped pulsar ring made of a metallic material.

Accordingly, such changes and modifications are, unless they depart from the scope of the present invention as delivered from the claims annexed hereto, to be construed as included therein.

What is claimed is:

1. A rotation detecting device arranged in face-to-face relation with a metallic body or magnet body provided in a rotational member, the rotation detecting device comprising:
   a magnetic sensor;
   peripheral component parts electrically or mechanically connected with the magnetic sensor, the peripheral components including an electrode electrically connected with the magnetic sensor, a cable core line electrically connected with the electrode, a cable insulating sheath to electrically insulate the cable core line, and a portion of a cable covering to cover an exterior of the cable insulating sheath; and
   a fixture made of a metallic material, the fixture being configured to directly contact and support the magnetic sensor, the cable insulating sheath and the portion of the cable covering to position the magnetic sensor and the peripheral component parts;
   the magnetic sensor, the peripheral component parts and the fixture being molded together so as to be covered by a thermoplastic elastomer or a material capable of exhibiting a rubber elasticity.

2. The rotation detecting device as claimed in claim 1, further comprising an electric terminal of the magnetic sensor,
   wherein the electric terminal or the electrode and the thermoplastic elastomer or the material capable of exhibiting the rubber elasticity are sealingly bonded together by the molding.

3. The rotation detecting device as claimed in claim 1, further comprising a connecting member to integrally connect the magnetic sensor and the fixture together,
   wherein the magnetic sensor, the peripheral component parts, the fixture and the connecting member are molded together so as to be covered by the thermoplastic elastomer or the material capable of exhibiting the rubber elasticity.

4. The rotation detecting device as claimed in claim 1, further comprising a cable clamp affixed to the fixture to hold the cable covering,
   wherein the magnetic sensor, the peripheral component parts, the fixture and the cable clamp are molded together so as to be covered by the thermoplastic elastomer or the material capable of exhibiting the rubber elasticity.

5. The rotation detecting device as claimed in claim 1, in which the thermoplastic elastomer or the material capable of exhibiting the rubber elasticity to cover the cable core line is externally pressed so that the thermoplastic elastomer or the material capable of exhibiting the rubber elasticity and an outer skin of the cable are tightly sealed together.

6. The rotation detecting device as claimed in claim 5, further comprising a press-fixing member to externally press the thermoplastic elastomer or the material capable of exhibiting the rubber elasticity, which covers the cable core line.

7. The rotation detecting device as claimed in claim 1, further comprising an annular cable sealing member capable of being plastically deformed in a direction radially inwardly thereof and provided on an outer periphery of the cable insulating sheath with the magnetic sensor with a gap intervening therebetween,
   wherein the magnetic sensor, the peripheral component parts, the fixture and the cable sealing member are molded together so as to be covered by the thermoplastic elastomer or the material capable of exhibiting the rubber elasticity, and
   wherein the cable sealing member is plastically deformed in a direction radially inwardly thereof together with a portion of the thermoplastic elastomer or the material capable of exhibiting the rubber elasticity, which portion covers an outer peripheral portion of the cable insulating sheath.

8. The rotation detecting device as claimed in claim 1, further comprising a ring member, provided on an outer periphery of the thermoplastic elastomer or the material capable of exhibiting the rubber elasticity, to hold the thermoplastic elastomer or said material and the cable covering member in a fastened condition.

9. A method of manufacturing a rotation detecting device, comprising:
   loading a magnetic sensor having an electric terminal to be arranged in face-to-face relation with a magnet body or a metallic body provided on a rotational member, peripheral component parts electrically or mechanically connected with the magnetic sensor, a fixture, made of a metallic material, to position the magnetic sensor, and a thermoplastic elastomer or a material capable of exhibiting the rubber elasticity into a mold assembly, the peripheral components including an electrode electrically connected with magnetic sensor, a cable core line electrically connected with the electrode, a cable insulating sheath to electrically insulate the cable core line and a portion of a cable covering to cover an exterior of the cable insulating sheath, the fixture being configured to directly contact and support the magnetic sensor, the cable insulating sheath and the portion of the cable covering; and compressive molding the magnetic sensor and the peripheral component parts so as to be covered by the thermoplastic elastomer or said material within the mold assembly.

10. The method of manufacturing the rotation detecting device as claimed in claim 9, in which the mold assembly includes an upper mold and a lower mold and in which the compressive molding comprises:

intervening and sandwiching the magnetic sensor, the peripheral component parts and a rubber material mixed with a vulcanizing agent between the upper mold and the lower mold;

heating at least one of the upper mold and the lower mold; and subsequent to the heating, applying a pressure between the upper mold and the lower mold.

11. The method of manufacturing the rotation detecting device as claimed in claim 9, in which the mold assembly includes an upper mold and a lower mold and in which the compressive molding comprises:

intervening and sandwiching the magnetic sensor, the peripheral component parts, the fixture and the thermoplastic elastomer or the material capable of exhibiting the rubber elasticity between the upper mold and the lower mold;

heating at least one of the upper mold and the lower mold; and subsequent to the previous substep, applying a pressure between the upper mold and the lower mold to allow the following two elements to be sealingly bonded together by vulcanization:

an electric terminal of the magnetic sensor or a metallic electrode and the thermoplastic elastomer or the material capable of exhibiting the rubber elasticity, or the fixture and the material capable of exhibiting the rubber elasticity.

12. The method of manufacturing the rotation detecting device as claimed in claim 9, in which the compressive molding comprises loading, in addition to the magnetic sensor, the peripheral component parts and the fixture, a connecting member connecting the magnetic sensor and the fixture and the thermoplastic elastomer or the material capable of exhibiting the rubber elasticity, into the mold assembly so that the magnetic sensor and the peripheral component parts are integrally compressive molded together so as to be covered by the thermoplastic elastomer or said material.

13. The method of manufacturing the rotation detecting device as claimed in claim 12, in which the mold assembly includes an upper mold and a lower mold and in which during the applying the pressure for the compressive molding step, an excessive portion of the material is expelled to the outside of the mold assembly through a gap formed beforehand between the upper mold and the lower mold.

14. The method of manufacturing the rotation detecting device as claimed in claim 9, in which the compressive molding comprises:

loading, in addition to the magnetic sensor, the peripheral component parts and the fixture, a cable clamp affixed to the fixture, the cable clamp being made of a metallic material and capable of holding the cable covering, and the thermoplastic elastomer or the material capable of exhibiting the rubber elasticity into the mold assembly so that the magnetic sensor and the peripheral component part are integrally molded together within the mold assembly so as to be covered by the thermoplastic elastomer or said material.

15. The method of manufacturing the rotation detecting device as claimed in claim 10, further comprising, subsequent to the compressive molding, sealing the thermoplastic elastomer or the material capable of exhibiting the rubber elasticity and an outer skin of the cable core line tightly together by pressing from outside the thermoplastic elastomer or the material capable of exhibiting the rubber elasticity then covering the cable core line.

16. The method of manufacturing the rotation detecting device as claimed in claim 9, in which the mold assembly includes an upper mold and a lower mold and in which the compressive molding executes compressively molding within the mold assembly, in addition to the magnetic sensor, the peripheral component parts and the fixture, an annular cable sealing member spacedly provided on an outer periphery of the cable insulating sheath, the cable seal member being capable of undergoing a plastic deformation in a radially inward direction, together with the thermoplastic elastomer or the material capable of exhibiting the rubber elasticity so as to be covered by the thermoplastic elastomer or said material; and the method further comprises, subsequent to the preceding compressive molding, plastically deforming the cable sealing member together with a portion of a covering material including the thermoplastic elastomer or said material, which portion covers an outer peripheral portion of the cable, in a direction radially inwardly thereof.

17. The method of manufacturing the rotation detecting device as claimed in claim 9, further comprising, subsequent to the compressive molding, providing a ring member to hold a covering material and the cable covering in a fastened condition in the covering material, wherein the covering material includes the material capable of exhibiting the rubber elasticity or the thermoplastic elastomer.

18. A wheel support bearing assembly for supporting a vehicle wheel rotatably relative to a vehicle body structure, comprising:

an outer member having double row rolling surfaces formed in an inner periphery thereof;

an inner member having an outer periphery formed with rolling surfaces in face-to-face relation with the rolling surfaces in the outer member;

double row rolling elements interposed between the opposed rolling surfaces; and a rotation detecting device as defined in claim 1, which is fitted to one of the outer and inner members which serves as a stationary member, wherein the magnet body or the metallic body confronting the magnetic sensor of the rotation detecting device is fitted to the other of the outer and inner members which serves as a rotational member.

* * * * *